United States Patent
Dembo

(10) Patent No.: US 7,937,636 B2
(45) Date of Patent: May 3, 2011

(54) SEMICONDUCTOR DEVICE AND INSPECTION METHOD OF SEMICONDUCTOR DEVICE AND WIRELESS CHIP

(75) Inventor: Hiroki Dembo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/692,785

(22) Filed: Jan. 25, 2010

(65) Prior Publication Data
US 2010/0123555 A1    May 20, 2010

Related U.S. Application Data

(62) Division of application No. 11/494,466, filed on Jul. 28, 2006, now Pat. No. 7,669,094.

(30) Foreign Application Priority Data

Aug. 5, 2005 (JP) ................................. 2005-228639

(51) Int. Cl.
*G01R 31/28* (2006.01)
(52) U.S. Cl. ...................................... 714/733; 714/718
(58) Field of Classification Search .................. 455/566; 710/305; 716/1; 370/389; 345/84; 714/724, 714/738, 718, 733
See application file for complete search history.

(56) References Cited

U.S. PATENT DOCUMENTS

| | | | |
|---|---|---|---|
| 4,028,500 A * | 6/1977 | McClure et al. | 455/566 |
| 5,535,344 A * | 7/1996 | Le Van Suu | 710/305 |
| 6,442,724 B1 * | 8/2002 | Augarten | 714/738 |
| 6,509,217 B1 | 1/2003 | Reddy | |
| 6,680,940 B1 * | 1/2004 | Lewin et al. | 370/389 |
| 7,249,302 B2 | 7/2007 | Maltseff et al. | |
| 7,395,474 B2 | 7/2008 | Maltseff et al. | |
| 7,463,140 B2 | 12/2008 | Schmidt | |
| 2004/0150596 A1 * | 8/2004 | Uchida et al. | 345/84 |
| 2005/0158010 A1 * | 7/2005 | Ikeda et al. | 385/147 |
| 2007/0028194 A1 * | 2/2007 | Kurokawa | 716/1 |
| 2008/0093454 A1 | 4/2008 | Yamazaki et al. | |

FOREIGN PATENT DOCUMENTS

| | | |
|---|---|---|
| JP | 2001-307047 | 11/2001 |
| JP | 2003-057300 | 2/2003 |
| JP | 2003-060047 | 2/2003 |

* cited by examiner

*Primary Examiner* — David Ton
(74) *Attorney, Agent, or Firm* — Eric J. Robinson; Robinson Intellectual Property Law Office, P.C.

(57) ABSTRACT

The invention provides an inspection method of a semiconductor device which receives a test program wirelessly. As an inspection method of the semiconductor device, a test program is transmitted as a communication signal for every test. By transmitting a test program as a communication signal wirelessly in the case of an operation test, test contents are changed as required. As a result, a test program can be easily changed and an inspection circuit or the like is not required. In this manner, manufacturing cost of a wireless chip can be reduced.

18 Claims, 28 Drawing Sheets

R/W → WIRELESS CHIP

WIRELESS CHIP → R/W 1601
1602

1601  1603

1601
1604

1601
1605

SEMICONDUCTOR DEVICE AND INSPECTION METHOD OF SEMICONDUCTOR DEVICE AND WIRELESS CHIP

BACKGROUND OF THE INVENTION

1. Field of the Invention

The invention relates to an inspection method for simply inspecting a semiconductor device and a structure of a semiconductor device.

2. Description of the Related Art

In recent years, for various fields that require automatic authentication such as securities and inventory control of products, a card mounting an RFID (Radio Frequency Identification) chip or an RFID tag that is capable of giving and receiving data wirelessly are increasingly required. A card mounting an RFID chip has a larger memory capacity and is superior in security than a magnetic card which stores data by a magnetic recording method. Therefore, in recent years, modes of the card mounting an RFID chip that can be used for various fields have been suggested. Such a card mounting an RFID chip communicates data through an antenna having a suitable shape for a frequency band to be used for giving and receiving data; thereby data is read or written wirelessly with external devices.

In general, a semiconductor device such as an RFID tag is mass-produced and shipped after an inspecting process. As one of the inspection methods, there is a method to perform an inspection without supplying a driving power to a circuit or a substrate (see Patent Document 1). Patent Document 1 discloses a method in which an inspection circuit is incorporated in an integrated circuit in advance, a unique code is given to the inspection circuit, an operation power source is generated by receiving electromagnetic waves from outside, inspection is performed in accordance with a procedure based on the generated inspection signals, and the inspection result is transmitted to outside.

As another inspection method, there is a method to inspect the whole substrate including wiring patterns wirelessly (see Patent Document 2). Patent Document 2 discloses a method in which an inspection circuit is incorporated in an integrated circuit in advance, a unique code is given to the inspection circuit, a driving power for the inspection circuit is generated by receiving electromagnetic waves by a reception portion of the inspection circuit, an inspection control procedure is wirelessly received from the inspection device similarly, and the result is transmitted to the inspection device.
Patent Document 1
Japanese Patent Laid-open No. 2003-57300
Patent Document 2
Japanese Patent Laid-open No. 2003-60047

SUMMARY OF THE INVENTION

In a conventional semiconductor device, a major inspection method was to mount an inspection circuit in the semiconductor device and carry out the inspection of the semiconductor device using the inspection circuit. However, in this method, the inspection circuit has to be changed for every change or update of a test program required for the inspection, which makes the change or update extremely difficult.

In view of the aforementioned, in the invention, a test program transmitted by wireless communication is stored in a data storing portion mounted in the semiconductor device, thereby the inspection is carried out by using the test program. The test program can be changed in accordance with a required inspection by erasing or writing through wireless communication. As the semiconductor device, a chip capable of wireless communication (hereinafter referred to as a wireless chip) can be suggested.

Hereafter, specific configurations of the invention is described.

One mode of the invention is a semiconductor device which includes a data storing portion and an antenna. The data storing portion includes a thin film transistor. The data storing portion stores a test program received through an antenna by wireless communication at least in a test step.

Another mode of the invention is a semiconductor device which includes a data storing portion, a reception circuit, a state control register, and an RF circuit. Each of the data storing portion, the reception circuit, the state control register, and the RF circuit includes a thin film transistor. The data storing portion stores a test program processed by the reception circuit after being received through the RF circuit by wireless communication at least in a test step, thereby the state control register becomes a test program execution state.

Further, the state control register may have a unit for rewriting a test program execution state flag into a test program execution state.

The data storing portion includes a read only memory and a random access memory.

The test program includes data containing a test routine for carrying out an operation test of the read only memory and the random access memory.

In the aforementioned mode including an arithmetic circuit and a transmission circuit, the arithmetic circuit may have a function to start the test program before the state control register changes into a test program execution state, change the state control register into a transmission processing state when the test program is terminated, output the transmission data processed by the transmission circuit so as to be suitable for the form of communication signals, and change the state control register into a reception processing state when the transmission is terminated.

Another mode of the invention is an inspection method of a semiconductor device including an arithmetic circuit, a data storing portion, a reception circuit, a state control register, and an RF circuit. The arithmetic circuit starts an operation in accordance with a state of the state control register. The arithmetic circuit reads a test program stored in the data storing portion and executes a test routine in the test program. The arithmetic circuit determines an execution result of the test routine and writes it to the data storing portion. The test program is processed by the reception circuit after being received as a communication signal through the RF circuit.

Another mode of the invention is an inspection method of a semiconductor device including an arithmetic circuit, a data storing portion, a reception circuit, a state control register, an RF circuit, and a transmission circuit. The test program is started when the state control register changes into a test program execution state. The arithmetic circuit reads a test program stored in the data storing portion and executes a test routine in the test program. The arithmetic circuit has a function to determine an execution result of the test routine, write the execution result to the data storing portion, change the state control register into a transmission processing state when the test program is terminated, output the transmission data processed by the transmission circuit so as to be suitable for the form of communication signals to a modulation circuit, and change the state control register into a reception processing state when the transmission is terminated. The test program is processed by the reception circuit after being received as a communication signal through the RF circuit.

In the aforementioned mode of the inspection method, the state control register may be changed into a transmission processing state by a unit for rewriting a reception state flag into an executing state.

Another mode of the invention is an inspection method of a wireless chip including an arithmetic circuit, a state control register, a data storing portion, an RF circuit, and a reception circuit. A liquid crystal element is provided on the wireless chip. A test program is processed by the reception circuit and stored in the data storing portion after being received as a communication signal through the RF circuit. The inspection result carried out by the test program is displayed by the liquid crystal element.

Another mode of the invention is an inspection method of a wireless chip including an arithmetic circuit, a state control register, a data storing portion, an RF circuit, and a reception circuit. A liquid crystal element is provided on the wireless chip. The wireless chip is placed between a laser light source and a light receptor. A test program is processed by the reception circuit and stored in the data storing portion after being received as a communication signal through the RF circuit. The inspection result carried out by the test program is determined by whether light from the laser light source is inputted to the light receptor or not.

In the aforementioned inspection method of a wireless chip, the liquid crystal element may be formed of substrates provided with polarizing plates, which sandwich liquid crystal molecules.

By the invention, a power source voltage is supplied by an induced electromotive force of a communication signal. In a wireless chip which transmits and receives communication data, a test program is transmitted for every test as a communication signal in the case of an operation test of a component of the wireless chip. As a result, test contents can be flexibly changed as required. In this manner, manufacturing cost of the wireless chip can be reduced.

By forming a wireless chip of the invention using a thin film transistor formed of a semiconductor thin film as an active layer, which is formed over a substrate having an insulating surface, such as a glass substrate, a quartz substrate, and a plastic substrate, a highly functional and low power consumption wireless chip can be provided.

DETAILED DESCRIPTION OF THE INVENTION

Figure 1:
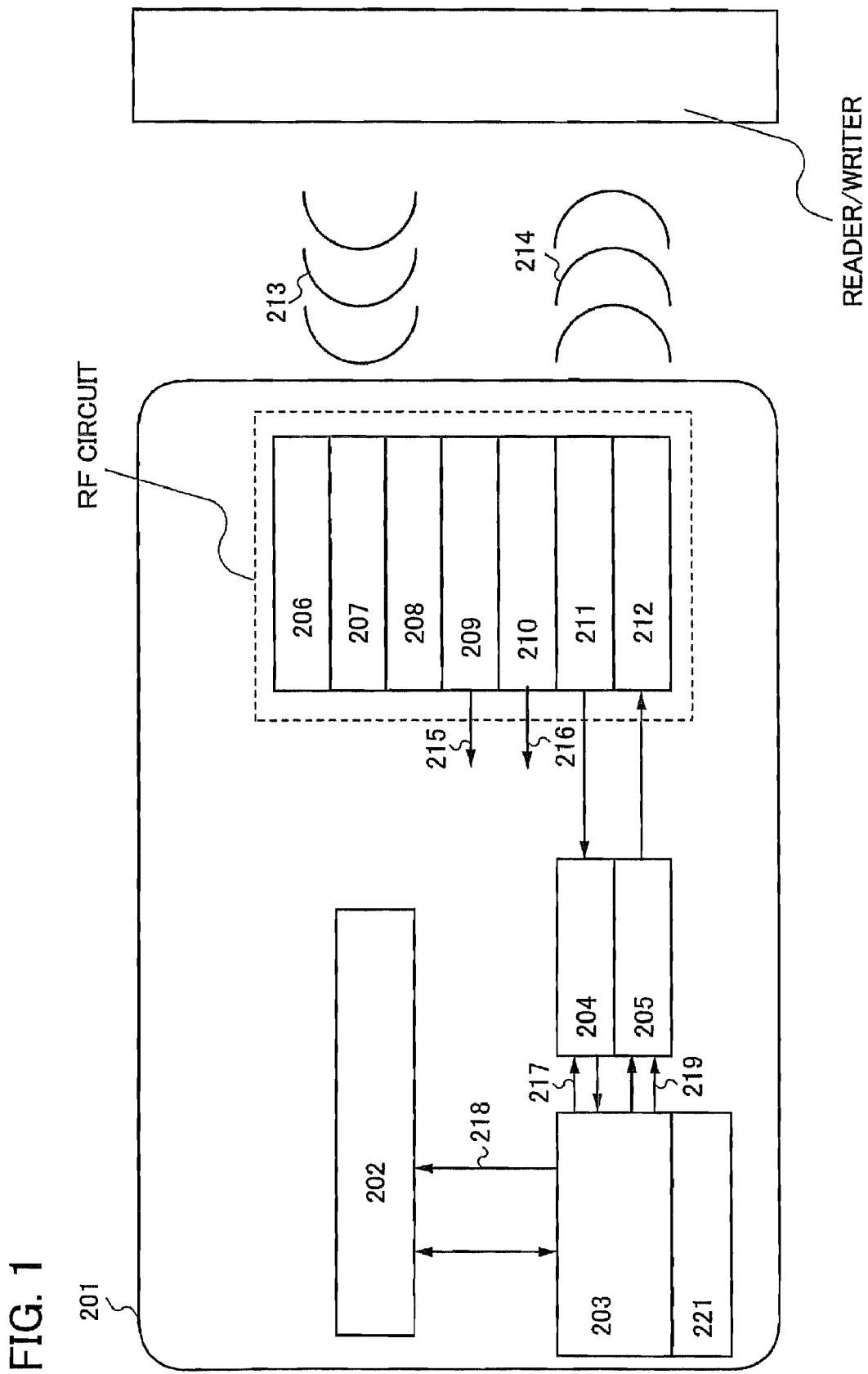
FIG. 1 is a block diagram showing a semiconductor device of the invention.

Although the present invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein. Note that identical portions in embodiment modes are denoted by the same reference numerals and detailed descriptions thereof are omitted.

Embodiment Mode 1

This embodiment mode describes a block diagram of a wireless chip as an inspection target of the invention, a device configuration, and a flow chart for realising an inspection method of a wireless chip.

FIG. 1 is a block diagram of a wireless chip as an inspection target of the invention.

In FIG. 1, a wireless chip 201 includes a data storing portion 221, an arithmetic circuit 202, a state control register 203, a reception circuit 204, a transmission circuit 205, an antenna 206, a resonant circuit 207, a power source circuit 208, a reset circuit 209, a clock circuit 210, a demodulation circuit 211, and a modulation circuit 212. The wireless chip 201 can transmit and receive a reception signal 213 and a transmission signal 214 by an RF circuit including the antenna 206, the resonant circuit 207, the power source circuit 208, the reset circuit 209, the clock circuit 210, the demodulation circuit 211, and the modulation circuit 212. It is to be noted in FIG. 1 that the reception signal 213 and the transmission signal 214 are shown as different signals for simplicity; however, they are actually overlapped and simultaneously transmitted and received between the wireless chip 201 and a reader/writer.

In FIG. 1, when the wireless chip 201 is placed in a magnetic field formed by a communication signal, an induced electromotive force is generated by the antenna 206 and the resonant circuit 207. By the induced electromotive force, a power source voltage of the wireless chip 201 can be supplied. The induced electromotive force is held in electric capacitance of the power source circuit 208, which can stabilize a potential. The reset circuit 209 generates a system reset signal 215 which initializes the whole wireless chip 201. The system reset signal 215 has a clock waveform. For example, a signal which rises with a certain delay with respect to a rise of a power source voltage can be used as the system reset signal 215. The clock circuit 210 generates a clock signal from a communication signal. For example, when the communication signal passes through an inverter circuit after being rectified by a half-wave rectifying circuit, a clock signal having the same cycle as the communication signal can be generated. This clock signal may be used as a system clock signal 216 in the wireless chip 201 or may further be divided to be used as the system clock signal 216. The demodulation circuit 211 detects a change in amplitude of the reception signal 213 as a signal "0" or "1". As the demodulation circuit 211, for example, a low pass filter is used. The modulation circuit 212 transmits transmission data by changing amplitude of the transmission signal 214. For example, in the case where transmission data is "0", a resonant point of the resonant circuit 207 is changed to change amplitude of a communication signal. The state control register 203 shows a reception processing state, a data executing state, or a transmission processing state. By changing the state control register 203, transition among the aforementioned states can be realized. In specific, a specific bit of the state control register 203 is set as a reception processing state flag bit, a test program executing state flag bit, or a transmission processing state flag bit. For example, when each state flag bit is "1", each state is obtained. That is, in this case, when the reception processing state flag bit is "1", the wireless chip 201 is in a reception processing state.

The data storing portion 221 includes a memory element which stores test program data and a test result contained in reception data received from the reader/writer. As the memory element, a read only memory (ROM) or a random access memory (RAM) can be used. ROM includes a mask ROM (Read Only Memory) or the like while RAM includes an SRAM (Static Random Access Memory) or the like. In specific, the test program data contains a test routine for carrying out an operation inspection of the ROM or RAM and the inspection result contains a defective address and defect information of the ROM or RAM.

In the reception processing state, the reception circuit 204 operates and the arithmetic circuit 202 and the transmission circuit 205 stop operations. Moreover, in the arithmetic processing state, the arithmetic circuit 202 operates and the reception circuit 204 and the transmission circuit 205 stop operations. Further, in the transmission processing state, the transmission circuit 205 operates and the reception circuit 204 and the arithmetic circuit 202 stop operations.

In order to stop a clock signal supply in the aforementioned state control, for example, an enable signal 217 of a clock signal supplied to the reception circuit 204 when the reception processing state flag bit is "1", a reset signal of the arithmetic circuit 202 is set "0" and an enable signal 218 of a clock signal supplied to the arithmetic circuit 202 is set "1" when the arithmetic processing state flag bit is "1", and an enable signal 219 of a clock signal supplied to the transmission circuit 205 is set "1" when the transmission processing state flag bit is "1".

More specifically, logical multiplication of the system reset signal 215 and the enable signal 217 is used as a clock signal supplied to the reception circuit 204 and logical multiplication of the system reset signal 215 and the enable signal 218 is used as a clock signal supplied to the arithmetic circuit 202, and logic multiplication of the system reset signal 215 and the enable signal 219 is used as a clock signal supplied to the transmission circuit 205.

By supplying a clock signal to only a required circuit as described above, power consumption of the whole wireless chip can be reduced.

Hereafter, an operation of the whole wireless chip is described with reference to the flow chart of FIG. 2.

The reception circuit 204 identifies and extracts SOF (Start Of Frame), reception data, and EOF (End Of Frame) from a signal demodulated by the demodulation circuit 211 (communication signal reception 271). In the case where EOF is extracted, reception data is stored in the data storing portion 221 and the state control register 203 is changed into a test program executing state (state control register setting 272). In order to change the state control register 203 into a test program executing state, a unit for rewriting the test program executing state flag into "1" is to be provided. In specific, when the reception circuit extracts EOF, the reception circuit 204 is to have a unit for changing the test program executing state flag into "1".

The arithmetic circuit 202 includes a dedicated circuit for executing a test program, for example, in transmitting and receiving test program data. When the test program executing state flag is "1", the test program is started (test program execution 273). Further, when the test program is terminated, the state control register is changed into a transmission processing state (state control register setting 274). In order to change the state control register 203 into a transmission processing state, a unit for rewriting the transmission state flag into "1" is to be provided. In specific, when the arithmetic circuit 202 terminates execution of the test program, the arithmetic circuit 202 is to have a unit for changing the transmission state flag into "1".

The transmission circuit 205 processes transmission data in accordance with the form, of the communication signal and outputs it to the modulation circuit 212 (communication signal transmission 275). When the transmission is terminated, the state control register is changed into a reception processing state (state control register setting 276). In order to change the state control register into the reception processing state, a unit for rewriting the reception state flag into "1" is to be provided. In specific, when the transmission circuit 205 terminates transmitting transmission data, the transmission circuit 205 is to have a unit for changing the reception state flag into "1".

Figure 3:
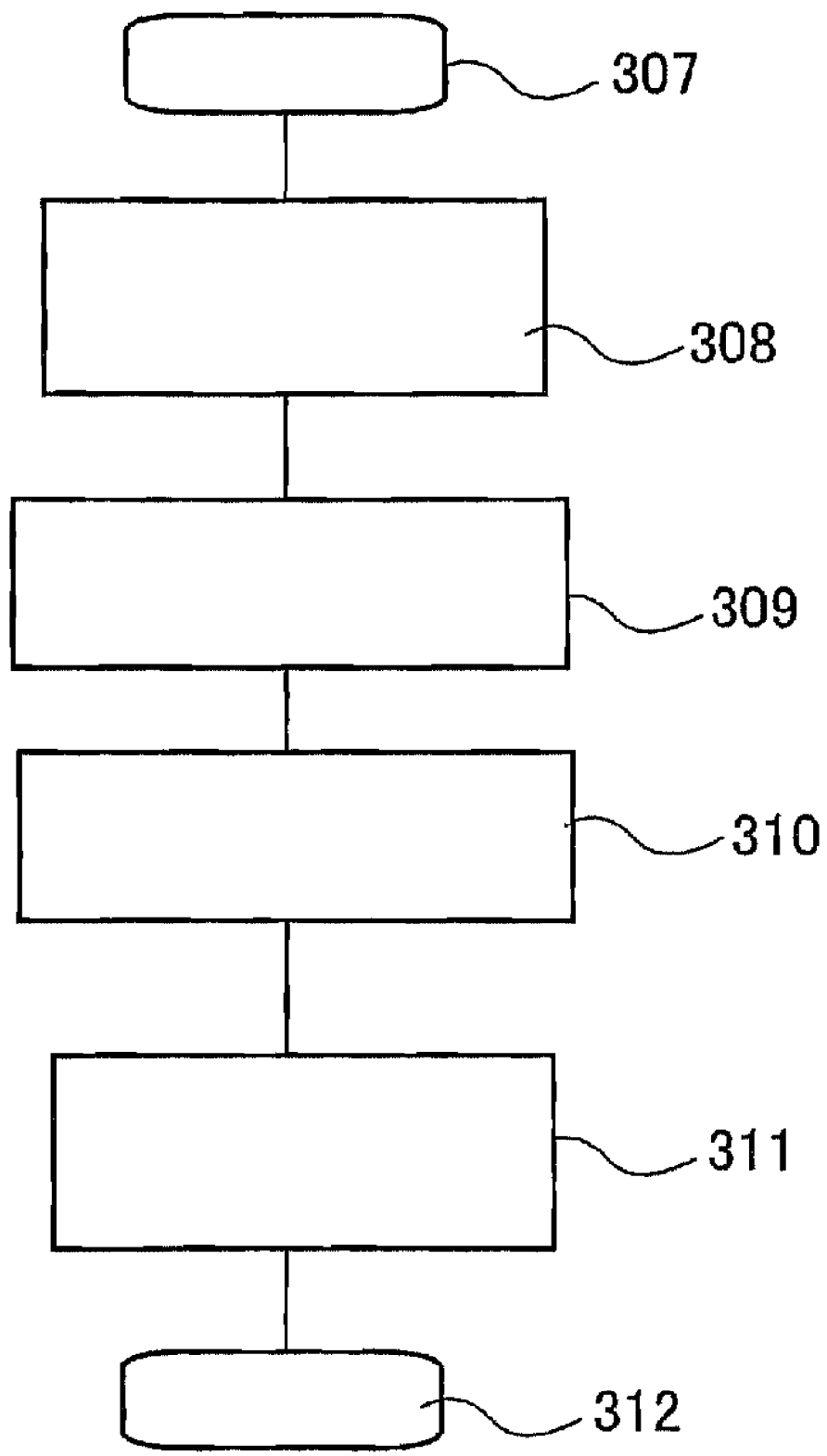
FIG. 3 is a flow chart showing an inspection method of the invention.

Next, description is made of an operation of a test program with reference to the flow chart of FIG. 3.

The arithmetic circuit 202 starts an operation by receiving a state of the state control register 203 (start 307). The arithmetic circuit 202 reads a test program from the data storing portion 221 (test program reading 308) and executes a test routine in the test program (test routine execution 309). The arithmetic circuit 202 determines an execution result of the test routine test result determination 310 and writes the results in the data storing portion 221 (test result writing 311). At last, the arithmetic circuit 202 terminates the operation (termination 312).

By executing the test program in this manner to transmit the test program as a communication signal for every test, test contents can be freely changed as required.

Figure 2:
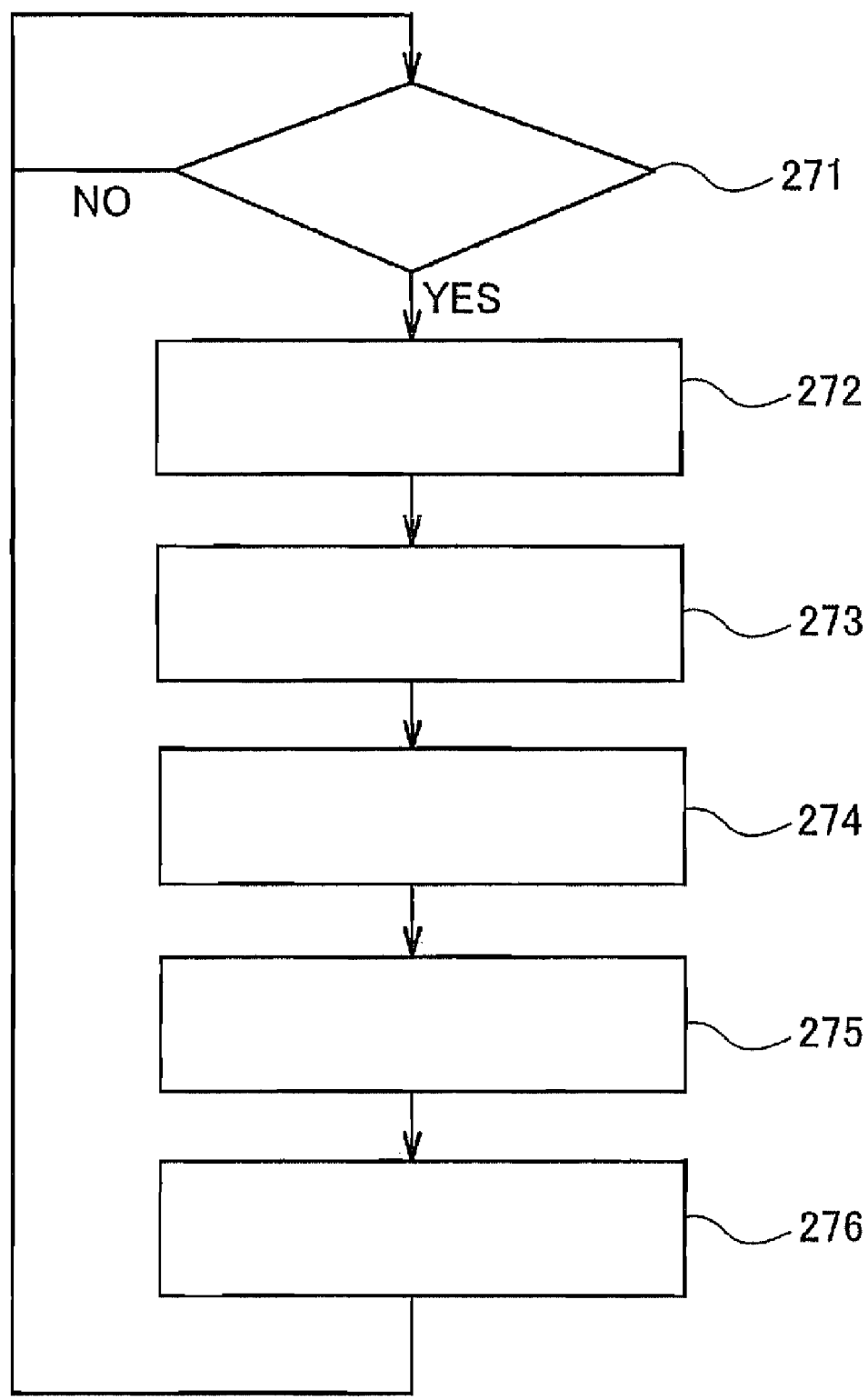
FIG. 2 is a flow chart showing an inspection method of the invention.

Next, description is made with reference to FIGS. 4 to 8 on an inspection device of a wireless chip which has the configuration of FIG. 1 and operates in accordance with the procedures of FIGS. 2 and 3.

Figure 4:
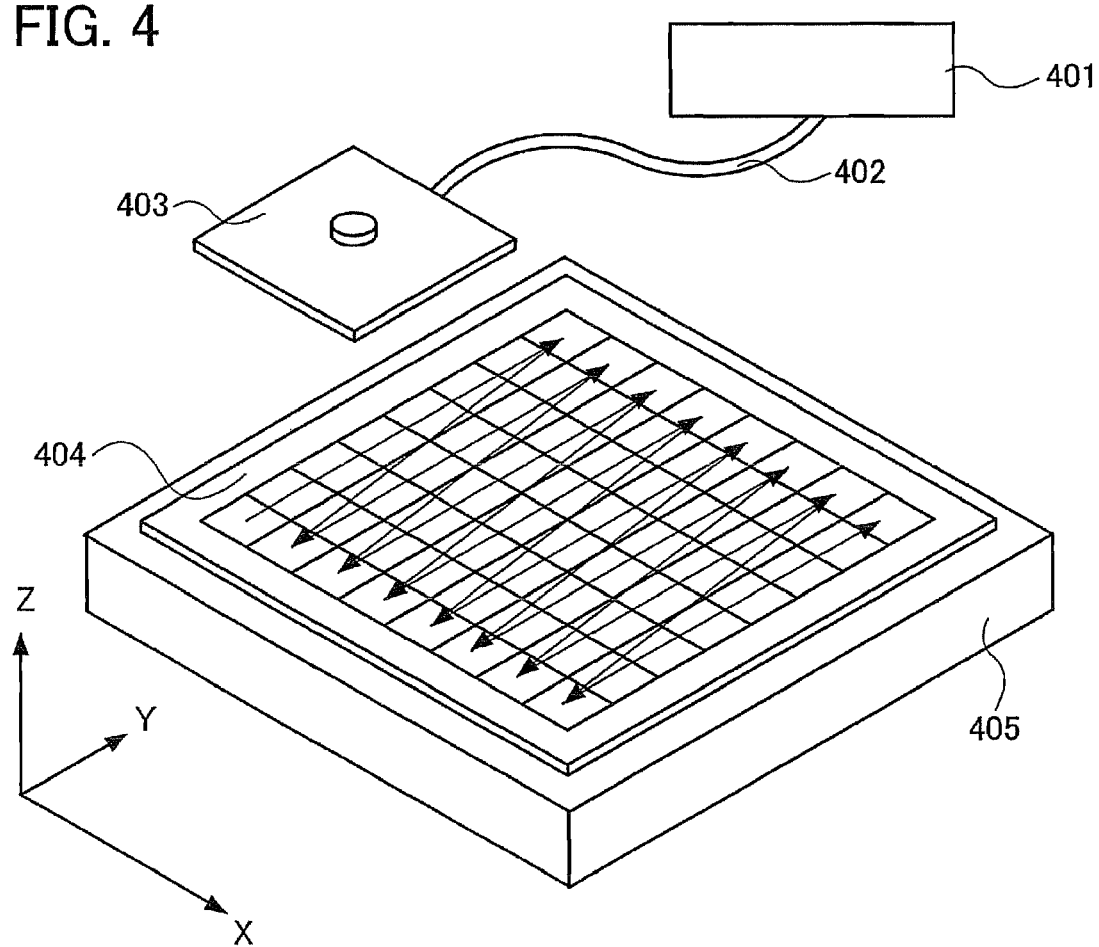
FIG. 4 is a view of an inspection device of the invention.
Figure 5:
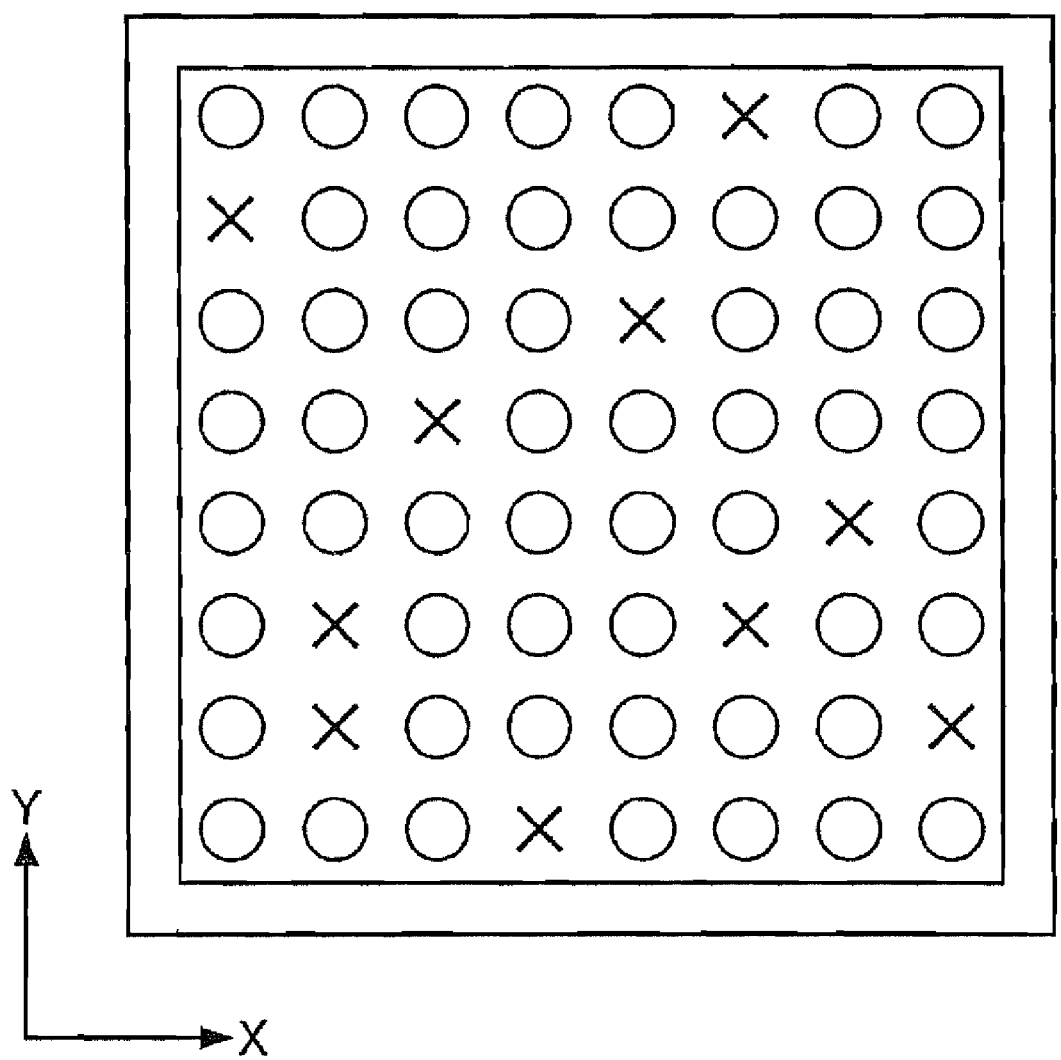
FIG. 5 is a display example of an inspection result of the invention.
Figure 7:
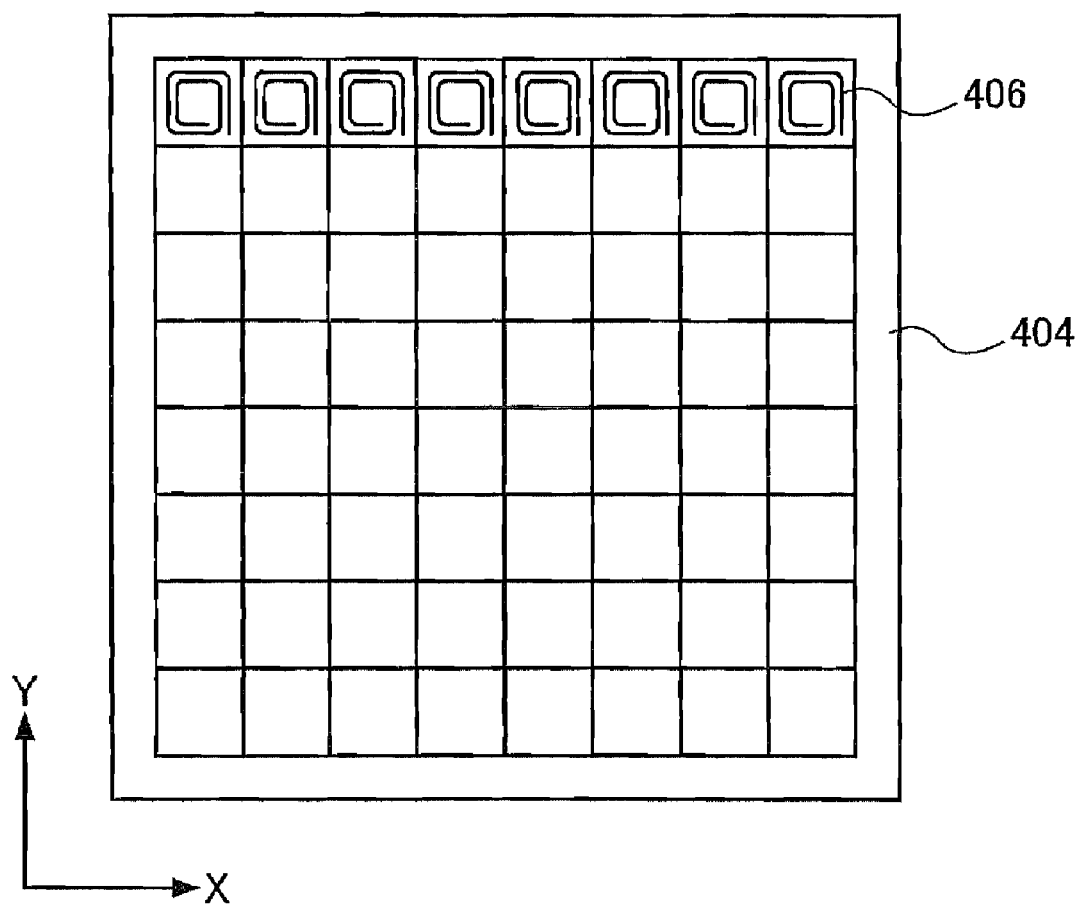
FIG. 7 is a view of an inspection object of the invention.

A substrate 404 shown in FIG. 4 is a large glass substrate over which a large number of wireless chips are formed. The wireless chip has a configuration as shown in FIG. 1. In specific, in the case of using a fourth generation glass substrate having a size of 600 mm×720 mm, about 4000 wireless chips each having a size of 1 cm square can be formed over one substrate. FIG. 7 shows a top plan view of the substrate 404. Each of the wireless chips has an antenna 406. By the antenna 406, wireless communication and wireless inspection can be carried out.

A prober control device 401 shown in FIG. 4 is connected to a wireless prober 403 through a cable 402 to control an operation of the wireless prober 403. The wireless prober 403 is to have a mechanism to operate in X, Y, and Z directions with respect to the substrate 404 placed over the stage 405.

Figure 22:
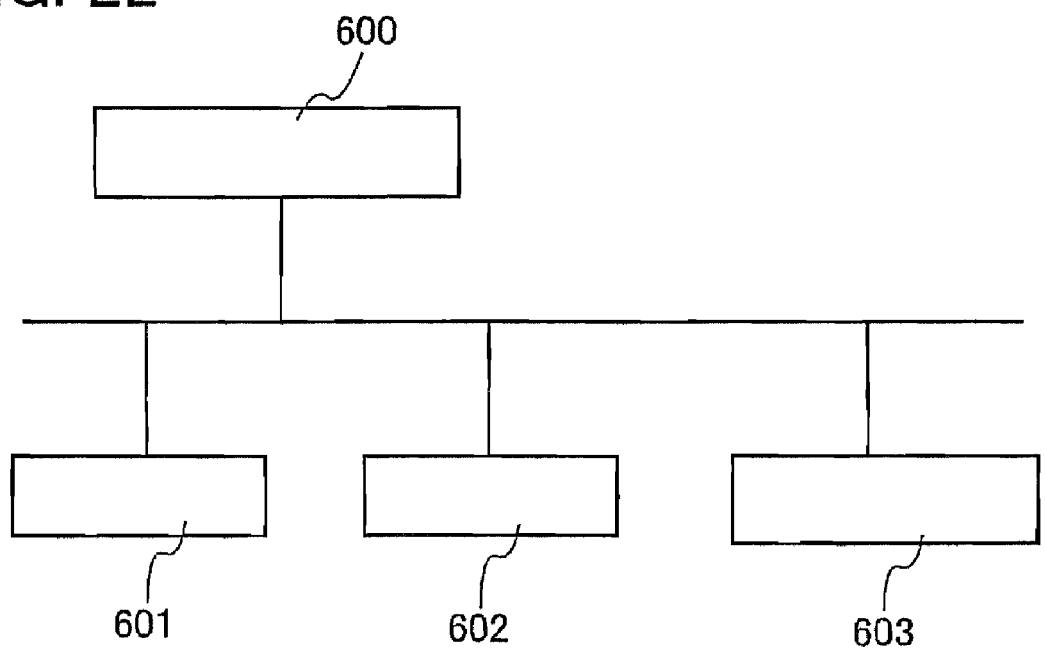
FIG. 22 is a block diagram showing an inspection device of the invention.

The prober control device 401 includes a host computer 600, a data transmission portion 601 connected to the computer, a data reception portion 602, and a stage control portion 603 as shown in FIG. 22. The prober control device 401 can transmit test program data to the wireless prober 403 by the data transmission portion 601. The prober control device 401 can receive the test program data from the wireless prober 403 by the data reception portion 602. The prober control device 401 can move the stage and the prober relatively by using the stage control portion 603.

The wireless prober 403 can transmit test program data to the antenna 406 of the appropriate wireless chip over the substrate 404 by using an incorporated wireless antenna. At this time, the prober control device 401 and the stage 405 are relatively moved in X, Y, and Z directions so that the antenna 406 of the wireless chip comes in a magnetic field of the wireless antenna formed by a communication signal. In specific, in the case of a wireless chip which operates at 13.56 MHz, the wireless chip is preferably at a distance of 2 to 3 cm from the wireless prober.

When all the wireless chips over the substrate 404 are inspected, throughput of the inspection step can be improved by, for example, fixing the stage 405 and operating the wireless prober 403 in a direction shown by an arrow over the substrate 404 since moving distance of the wireless prober 403 is short. Moreover, the wireless prober 403 may be fixed and the stage 405 may be moved in a direction shown by an arrow.

The wireless prober 403 can transmit test program data to the antenna 406 of the appropriate wireless chip and can transmit the inspection result received after the inspection to the prober control device 401 through the cable 402.

As for the inspection result, a defect distribution over the substrate can be determined at a glance by showing a non-defective unit as ○ and a defective unit as x. As the inspection result, the positions of the non-defective and defective units may be displayed by coordinates (x, y) or the number of non-defective and defective units may be displayed as well.

Figure 23:
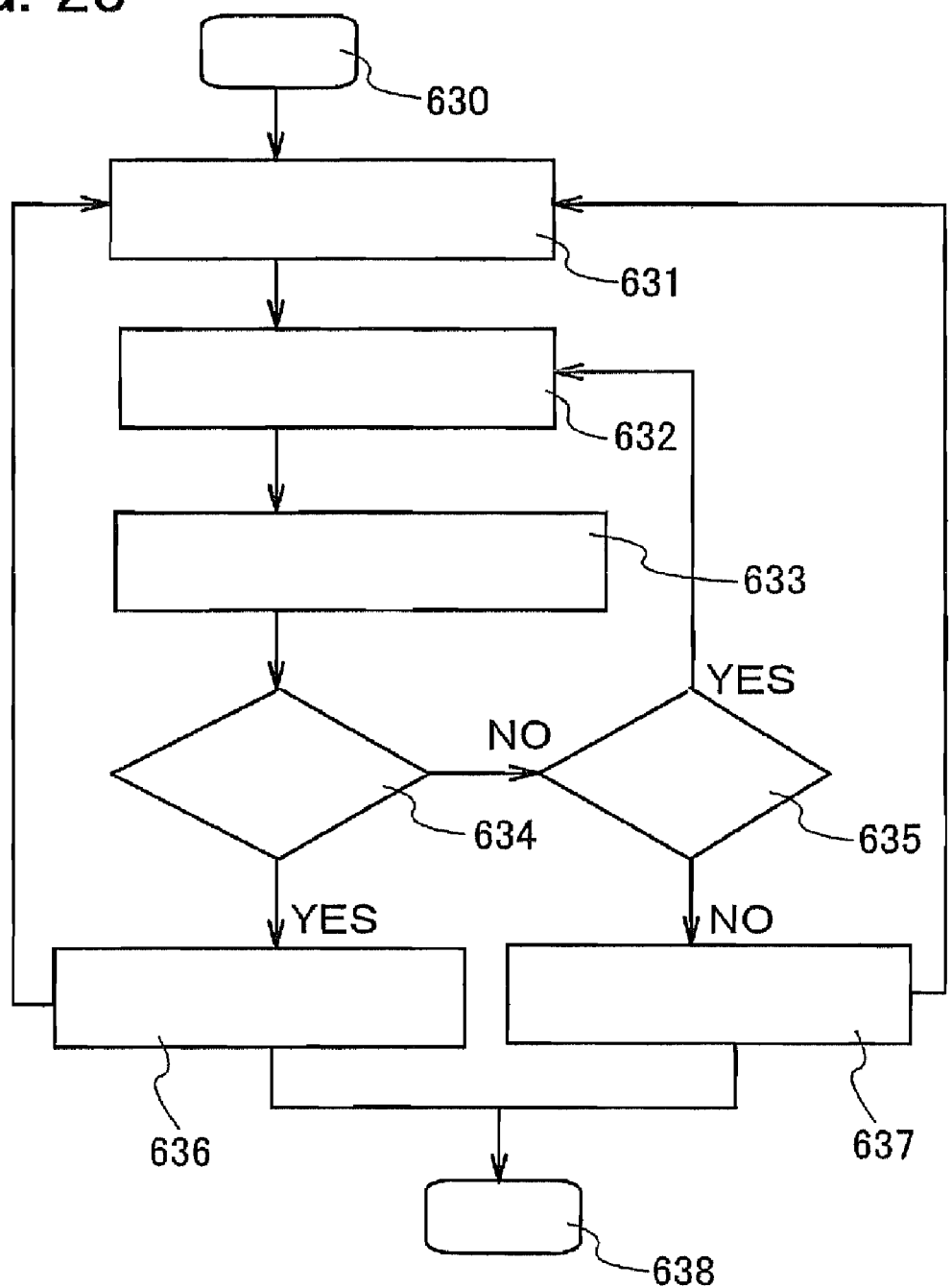
FIG. 23 is a flow chart showing an inspection method of the invention.

FIG. 23 is a flow chart of the inspection method. When the host computer 600 starts inspection (start 630), it moves the stage 405 to an inspection position (move the stage to an inspection position 631). After that, the host computer 600 transmits test program data to the data transmission portion 601 of the prober control device 401 (transmit test data to the data transmission portion 632). In specific, the data transmission portion 601 transmits the test program data to the appropriate wireless chip by the wireless prober 403. Next, the data reception portion 602 receives data from an appropriate wireless chip through a wireless prober and the host computer 600 receives data collected from the data reception portion 602 (receive data collected from the data reception portion 633). After that, the host computer 600 determines a test result to decide if the data matches or does not match (test result determination 634). If the inspection result is favorable (YES), stage coordinate data of the inspection position and an "OK" flag are stored in the host computer 600 (store stage coordinate data and "OK" 636). Then, the inspection is terminated (termination 638). On the other hand, if the inspection result is defective (NO), a retest may be carried out to make a determination (retest determination 635). In the case where the inspection result is defective (NO) even when the retest is carried out, stage coordinate data of the target position and an "NG" flag are stored in the host computer 600 (stage coordinate data and "NG" are stored 637). Then, the inspection is terminated (termination 638). The retest may be carried out as many times as required if only the retest is carried out twice or more including the first test. By carrying out the inspection a plurality of times, precision of test can be enhanced. Therefore, even when the inspection result is favorable (YES), a retest may be performed.

Figure 6:
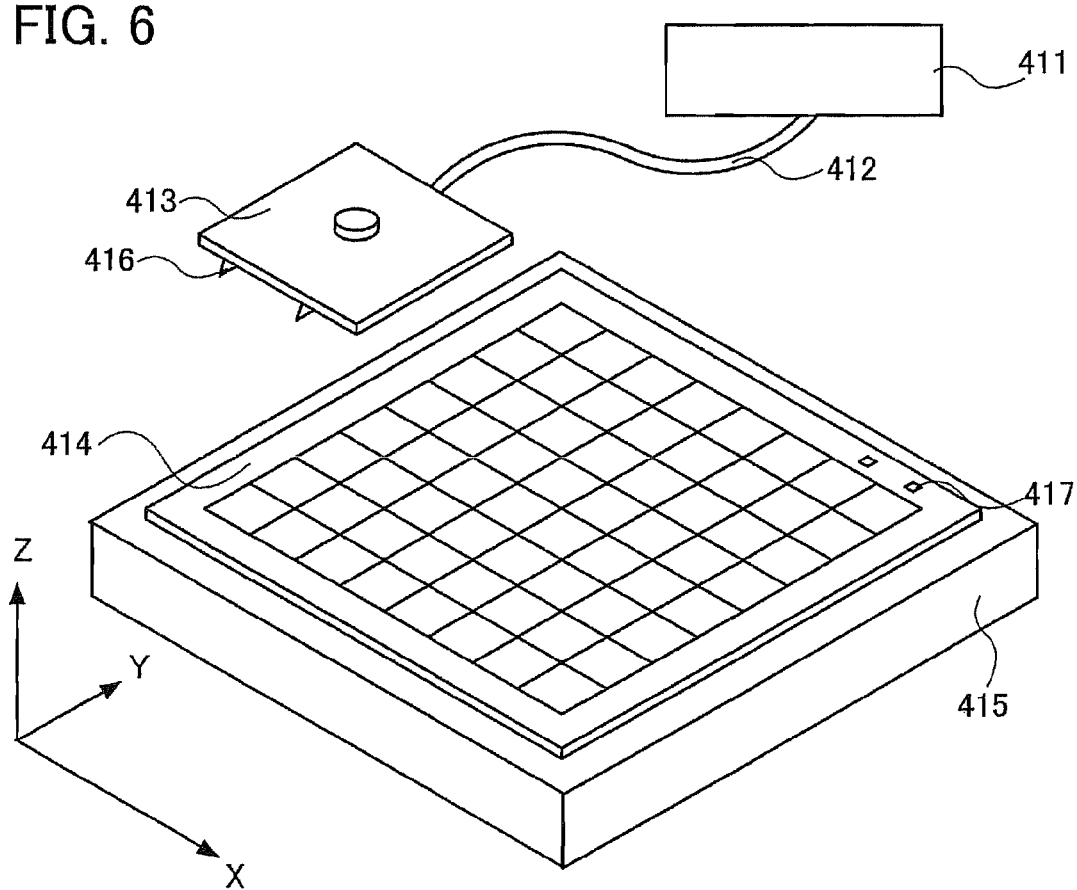
FIG. 6 is a view of an inspection device of the invention.

Next, an inspection device of a different mode is described. FIG. 6 shows a structure of an inspection device which can transmit and receive communication signals by a prober and perform an operation inspection of the wireless chip in addition to the inspection device shown in FIG. 4.

A prober control device 411 shown in FIG. 6 is connected to a wireless prober 413 through a cable 412 and controls an operation of the wireless prober 413 which includes a prober 416. The wireless prober 413 may be provided with a mechanism which operates in X, Y, and Z directions with respect to a substrate 414 placed over a stage 415. That is, it is only required that the prober control device 411 and the stage 415 can move relatively in X, Y, and Z directions similarly to FIG. 4.

Figure 8:
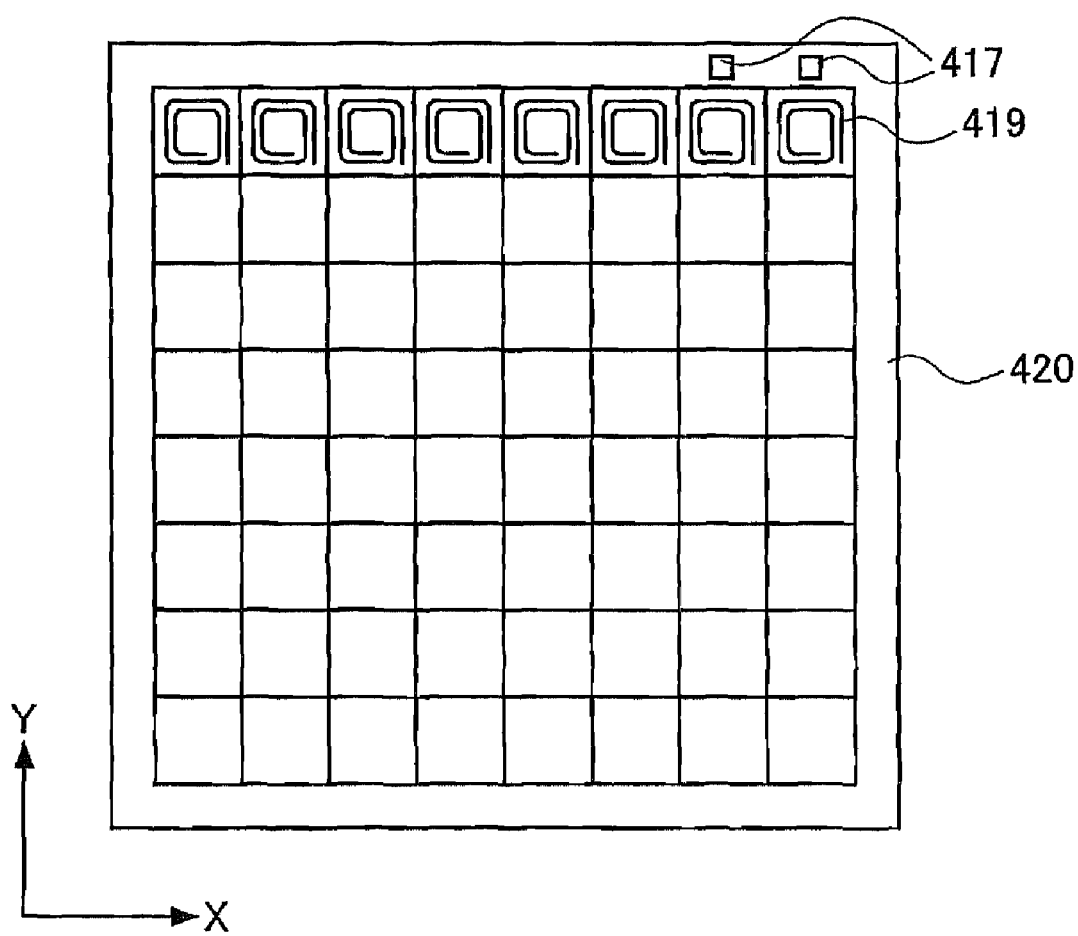
FIG. 8 is a view of an inspection object of the invention.

The substrate 414 is provided with an electrode pad 417. FIG. 8 is a top plan view of a substrate to be inspected by using the inspection device. A large amount of wireless chips are formed over a substrate 420, the electrode pad 417 is provided in a portion of the substrate 420, and the wireless chip includes an antenna 419. By directly connecting the prober 416 and the electrode pad 417 to contact so as to be electrically connected by such inspection device, communication signals containing test program data can be transmitted to the wireless chip as well.

By an inspection device of such a mode, a wireless chip can be inspected even when the antenna 419 over the substrate 420 has a defect and cannot be used.

According to the aforementioned mode, in a wireless chip which transmits and receives communication data by supplying a power source voltage by an induced electromotive force from communication signals, inspection contents can be flexibly changed as required by transmitting a test program as communication signals for every inspection when carrying out an operation inspection of a component of the wireless chip. In a conventional wireless chip incorporating an inspection circuit, a mask is required to be changed and remanufactured every time the inspection contents are changed. By using the invention, the inspection contents can be flexibly changed without changing nor remanufacturing a mask. As a result, manufacturing cost of a wireless chip can be reduced.

By forming a wireless chip of this embodiment mode by using a thin film transistor using a semiconductor thin film as an active layer, which is formed over an insulating substrate such as a glass substrate, a quartz substrate, or a plastic substrate, a highly functional and low power consumption wireless chip can be provided.

Embodiment Mode 2

This embodiment mode describes a device structure and a flow chart for realizing a wireless chip inspection method of the invention, a block diagram and an element structure of a wireless chip as an inspection target with reference to FIGS. 9 to 14.

Figure 9:
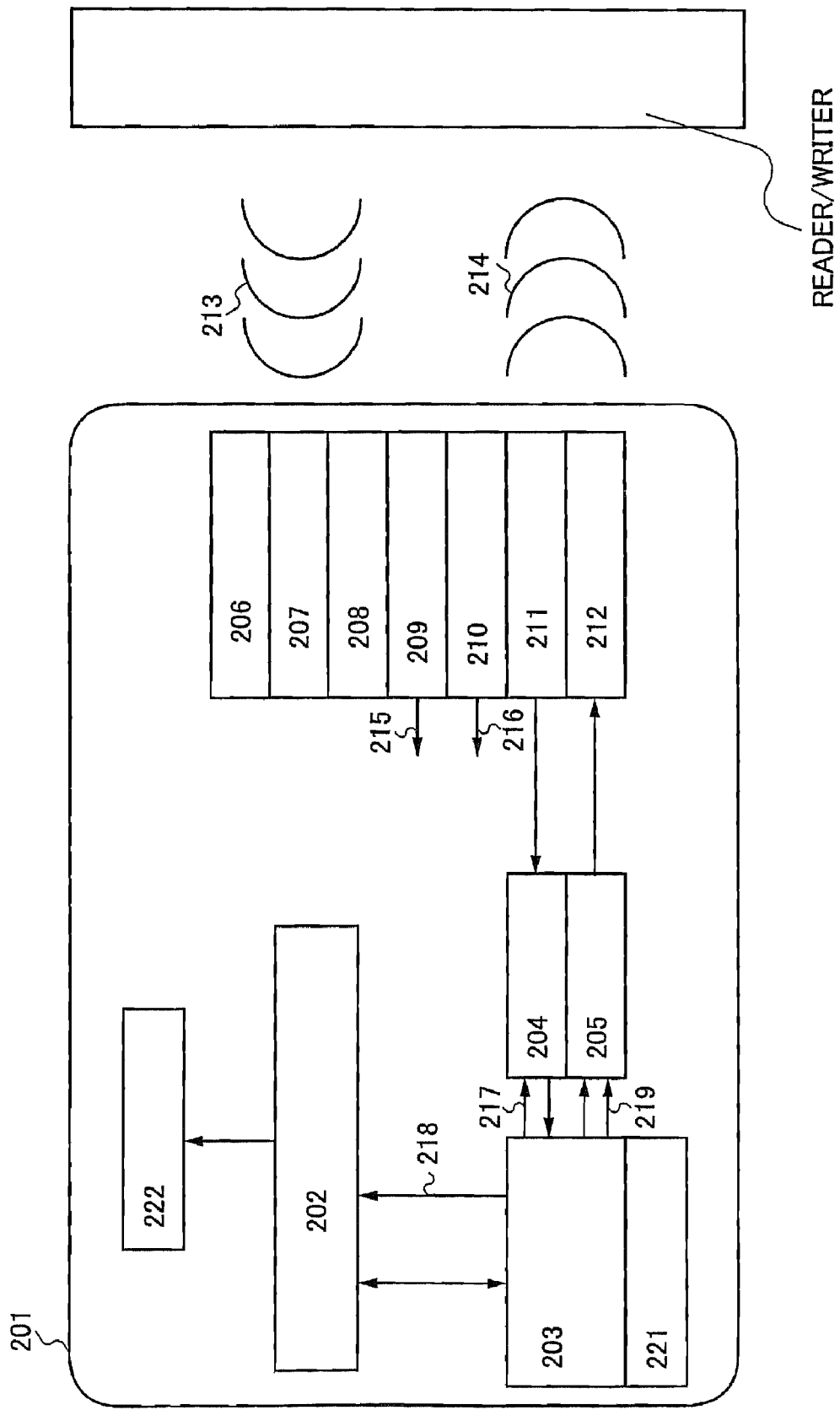
FIG. 9 is a block diagram showing a semiconductor device of the invention.

FIG. 9 is a block diagram of a wireless chip as an inspection target by a wireless chip inspection method of the invention. FIG. 9 corresponds to the block diagram of the wireless chip of Embodiment Mode 1, to which a liquid crystal driver portion 222 is additionally provided. FIG. 9 includes the data storing portion 221, the arithmetic circuit 202, the state control register 203, the reception circuit 204, the transmission circuit 205, the antenna 206, the resonant circuit 207, the power source circuit 208, the reset circuit 209, the clock circuit 210, the demodulation circuit 211, and the modulation circuit 212 similarly to FIG. 1. The liquid crystal driver portion 222 may include a switching element and a liquid crystal element, and a unit for controlling light transmission from the top surface of the substrate to the bottom surface thereof. The switching element can be formed using a thin film transistor (hereinafter also called a TFT). In specific, the liquid crystal driver portion 222 can determine to transmit or not to transmit light by applying a voltage to the switching element in accordance with the test result when the arithmetic circuit 202 executes a test program, thereby controlling liquid crystal molecules.

Figure 10:
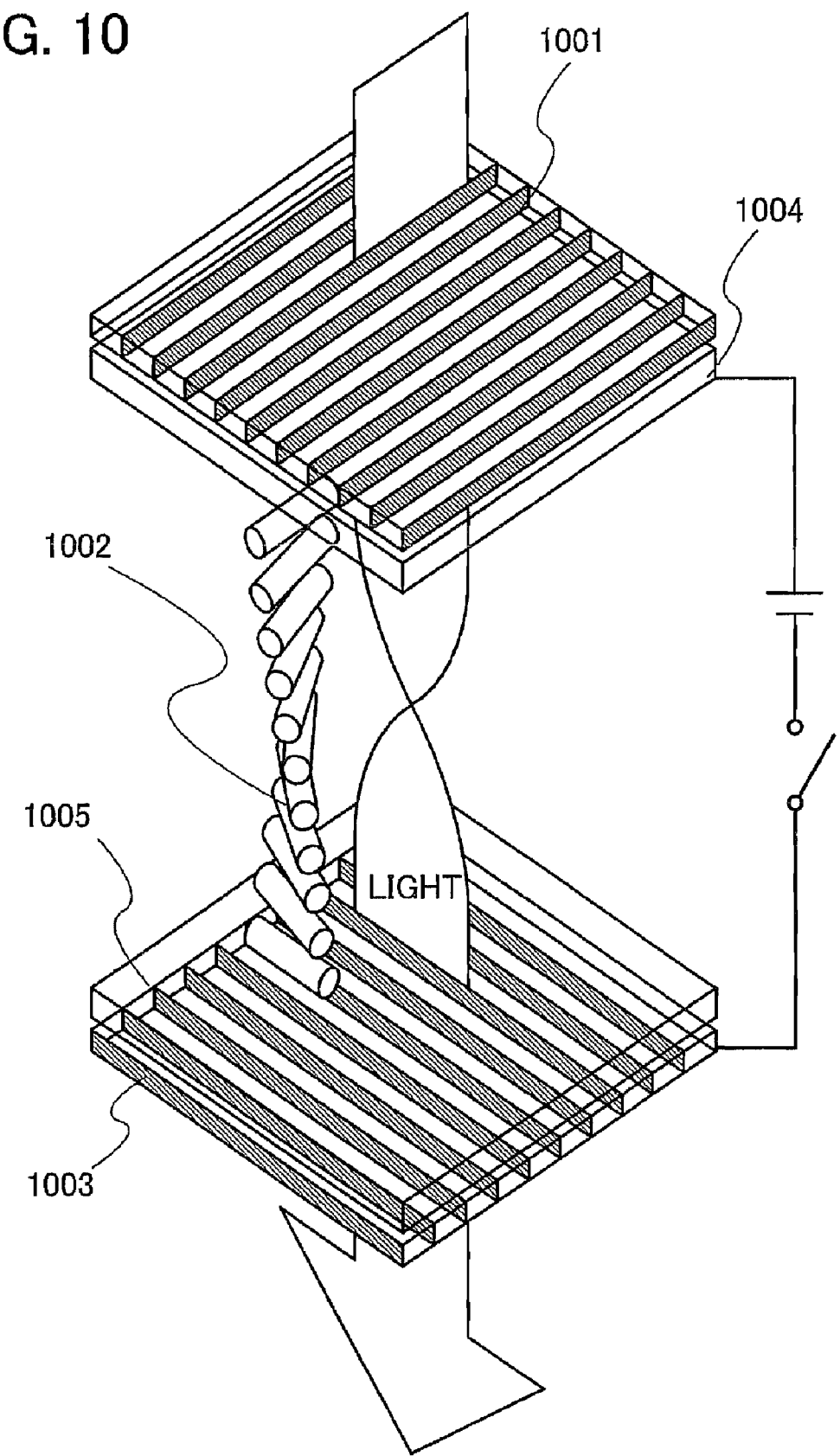
FIG. 10 is a view of an operation of liquid crystal elements applied to the invention.
Figure 11:
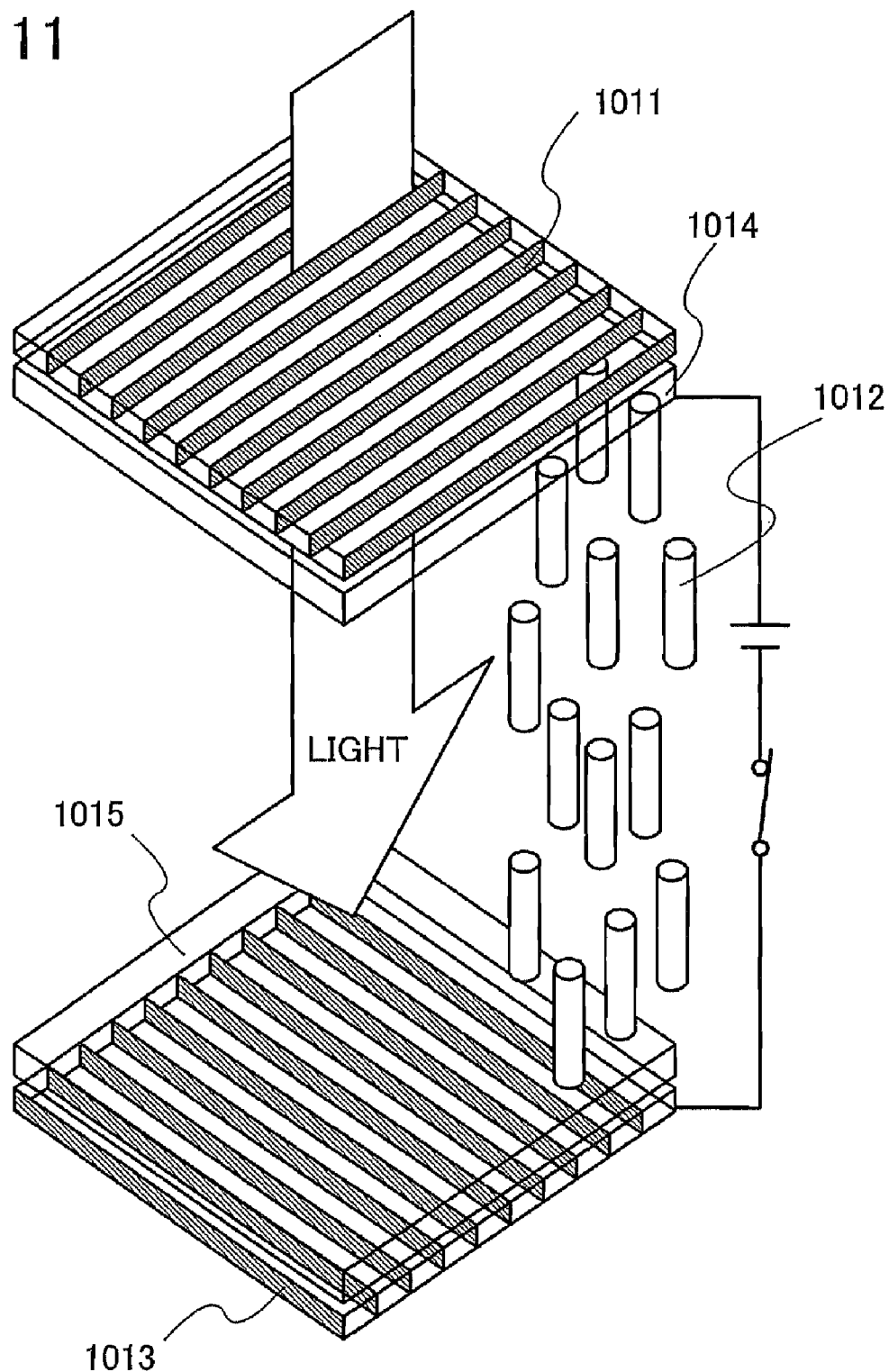
FIG. 11 is a view of an operation of liquid crystal elements applied to the invention.

FIGS. 10 and 11 schematically show operations of liquid crystal molecules which constitute the liquid crystal driver portion 222. These schematic views show a display principle of liquid crystals, which is generally called a TN (Twisted Nematic) type.

In FIG. 10, liquid crystal elements including a liquid crystal molecule 1002 are shown between a first polarizing plate 1001 provided for a first substrate 1004 and a second polarizing plate 1003 provided for a second substrate 1005. When a voltage is not applied to the liquid crystal elements, light incident from the first substrate 1004 transmits to the second substrate 1005. In specific, only the components of one direction of the incident light from the first substrate 1004 transmit by the first polarizing plate 1001, and are twisted at 90° in a spiral direction by the liquid crystal molecule 1002 and transmit through the second polarizing plate 1003 as twisted light, thereby light transmits from the first substrate 1004 to the second substrate 1005.

In FIG. 11, liquid crystal elements including a liquid crystal molecule 1012 are shown between a first polarizing plate 1011 provided for a first substrate 1014 and a second polarizing plate 1013 provided for a second substrate 1015. When a voltage is applied to the liquid crystal elements, light incident from the first substrate 1014 does not transmit to the second substrate 1015. In specific, only the components of one direction of the light incident from the first substrate 1014 transmit by the first polarizing plate 1011, however, it is blocked by the liquid crystal molecule 1012. Therefore, the light does not reach the second substrate 1015.

Figure 12:
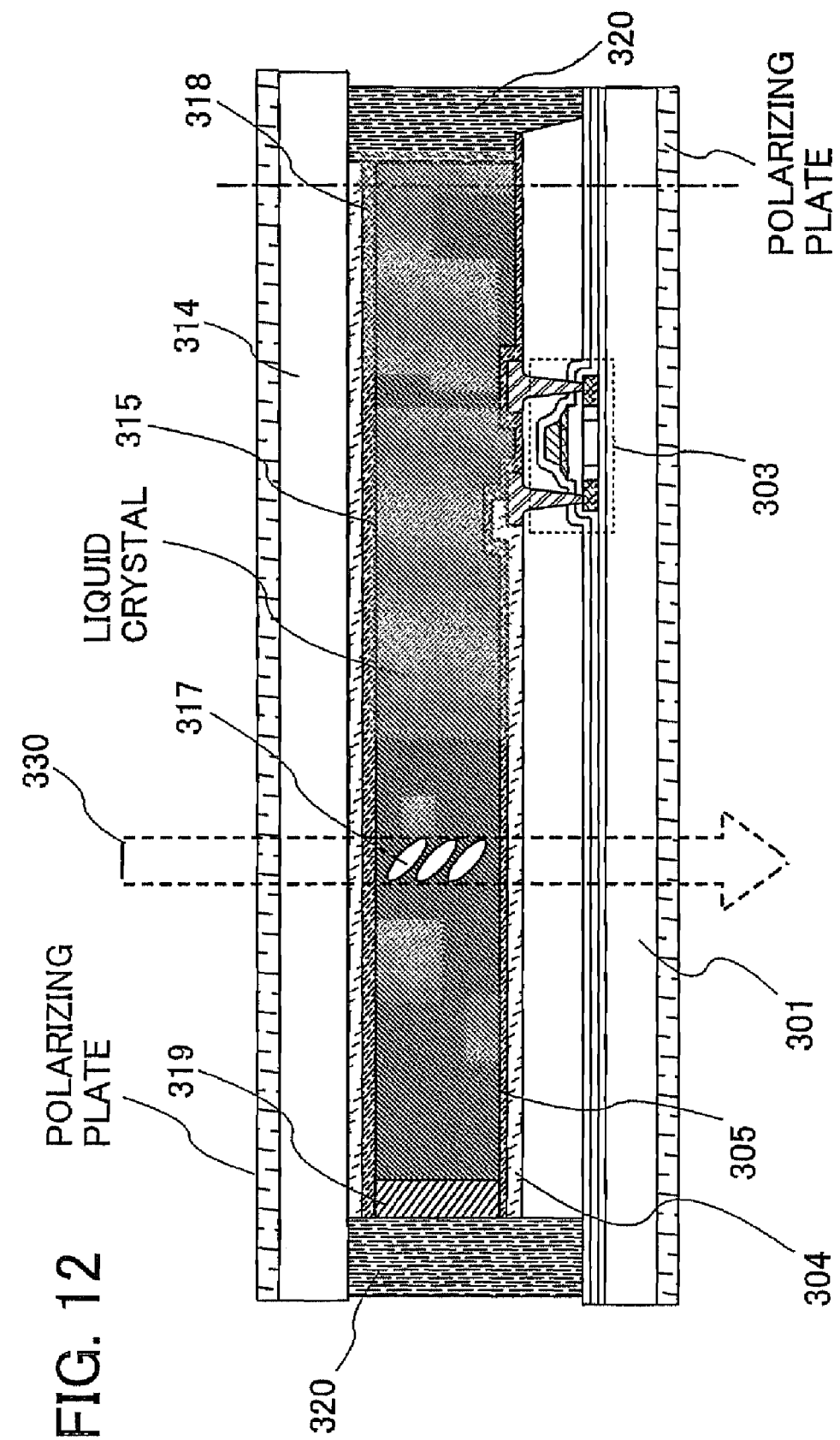
FIG. 12 is a sectional view of liquid crystal elements applied to the invention.

FIG. 12 is a sectional view of the liquid crystal driver portion 222. A TFT 303 is provided as a switching element over an insulating substrate 301 with a base layer interposed therebetween. A source or drain electrode of the TFT 303 is connected to a pixel electrode 304 to which a control signal from the TFT 303 is inputted. An alignment film 305 is provided so as to cover the pixel electrode 304 and the TFT 303. The tilts of liquid crystal molecules can be controlled by using the alignment film 305.

A counter substrate 314 is provided so as to oppose the insulating substrate 301. A counter electrode 318 and an alignment film 315 are sequentially provided over the counter substrate 314. A liquid crystal molecule 317 is provided between the insulating substrate 301 and the counter substrate 314. A space between the insulating substrate 301 and the counter substrate 314 is kept constant by a spacer 319. After the liquid crystal molecule 317 is provided, the insulating substrate 301 and the counter substrate 314 are fixed by a sealing material 320.

In such a liquid crystal driver portion 222, a voltage is applied to the liquid crystal molecule 317 by switching of the TFT 303. When the TFT 303 is off, transmitted light 330 reaches the insulating substrate 301.

Next, an operation of a test program of a wireless chip including the liquid crystal driver portion 222 is described with reference to FIG. 13.

The arithmetic circuit 202 included in a wireless chip starts an operation by receiving the state of the state control register 203 (start 307). The arithmetic circuit 202 reads a test program from the data storing portion 221 (test program read 308) and executes a test routine in the test program (test routine execution 309). The arithmetic circuit 202 determines an execution result of the test routine (test result determination 310) and applies a voltage to the liquid crystal driver portion 222 when an abnormality is detected (voltage application to liquid crystal driver portion 313). At last, the arithmetic circuit 202 terminates the operation (termination 312).

By executing a test program in this manner to apply a voltage to the liquid crystal driver portion 222 in accordance with a test result, transmission and non-transmission of light can be controlled.

Figure 13:
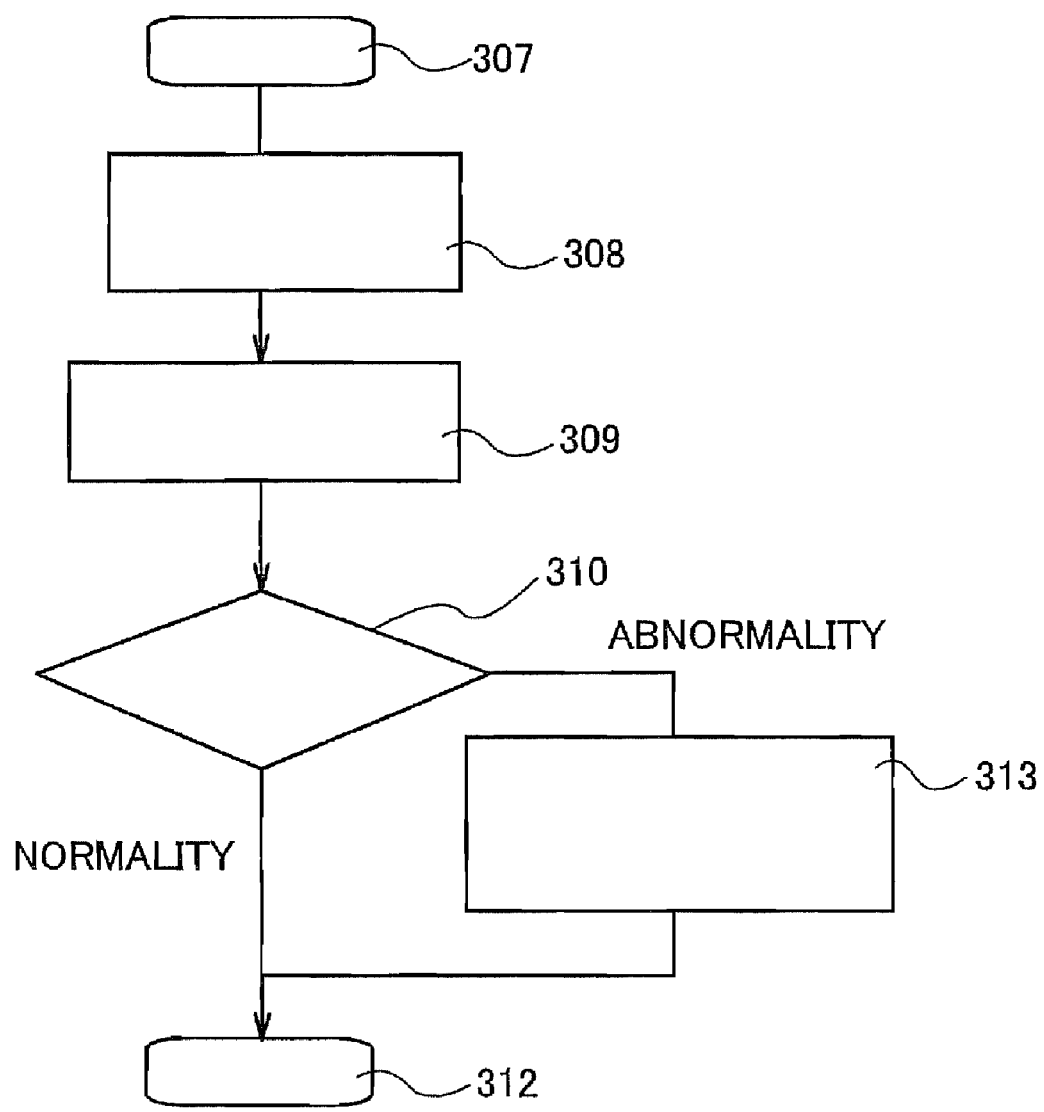
FIG. 13 is a flow chart showing an inspection method of the invention.

An inspection device and an inspection method of a wireless chip which have the configuration shown in FIG. 9 and can operate in accordance with a test program by the procedure shown in FIG. 13 is described with reference to FIGS. 14A and 14B. This inspection device is used in combination with the device described in Embodiment Mode 1. A structure to use an induced electromotive force from communication signals as an operation power source of the wireless chip is similar to Embodiment Mode 1; therefore, description thereof is omitted here.

Figure 14A:
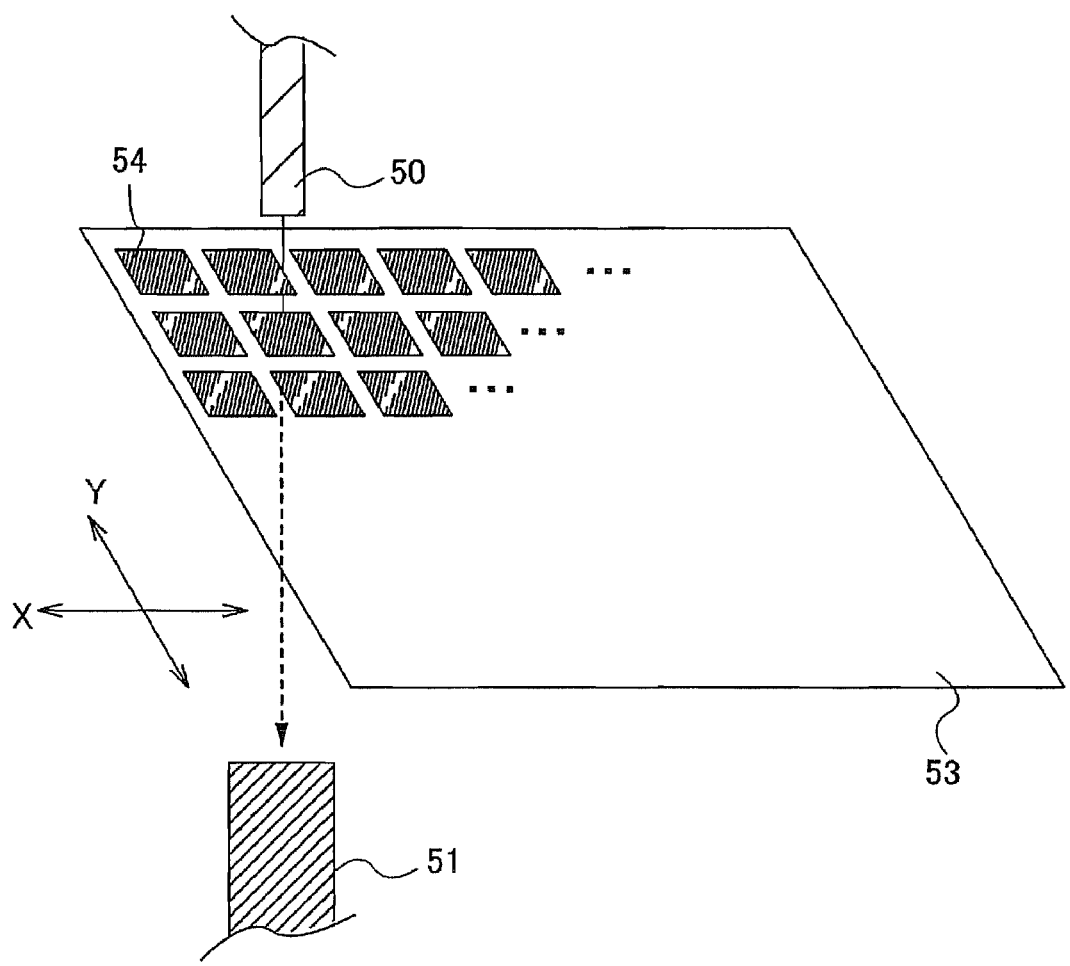
FIGS. 14A and 14B are views showing an inspection device and an inspection object of the invention.

A laser light source 50 shown in FIG. 14A is emitted in a perpendicular direction to an appropriate wireless chip 54 formed over an insulating substrate 53 and transmits through the wireless chip 54 to reach a light receptor 51. Therefore, the laser light source 50 and the light receptor 51 are required to have the same central axis.

The insulating substrate 53 and the laser light source 50 relatively move so that the laser light source incidents in the wireless chip 54 as an inspection target. For example, a unit for moving a stage to hold the insulating substrate 53 in X and Y directions may be provided.

Inside a spacer 57 of the wireless chip 54 is filled with a liquid crystal 56 which is controlled to transmit or not to transmit light by the liquid crystal driver portion 222. The insulating substrate 53 is divided in a cut region 58 after the inspection by the inspection device.

When light is emitted from the laser light source 50 to the appropriate wireless chip 54, the liquid crystal is driven if an execution result of a test program is normal, and thus a light of the laser light source 50 can not reach the light receptor 51. When the execution result of an inspection program is abnormal, the liquid crystal is not driven and the light emitted from the laser light source 50 reaches the light receptor 51. The light receptor 51 stores transmission or non-transmission for every chip and accumulates the data as defective data of the chip.

At this time, as the distance between the wireless chips 54 is narrow, anti-collision treatment is employed. By the anti-collision treatment, inspection can be carried out for only a specific wireless chip. The anti-collision treatment may be applied in the inspection device. It is to be noted that the anti-collision treatment is treatment for preventing the interference of signals.

As described above, a wireless chip can be inspected to be non-defective or defective depending on whether the light emitted from the laser light source 50 transmits or does not transmit therethrough.

In a wireless chip with the aforementioned mode, which is supplied with a power source voltage by an induced electromotive force from communication signals and transmits and receives communication data, an operation inspection can be carried out by the driving condition of the liquid crystals in the case of an operation inspection of the components of the wireless chip. Therefore, a result is not transmitted by communication, but detected by transmission or non-transmission of light. As a result, the wireless chip is not affected by an electric noise generated from the device in the inspection step.

When the inspection method described in this embodiment mode is used for manufacturing a wireless chip incorporating a liquid crystal display element, operation inspection of a display element and a wireless chip can be simultaneously carried out. Therefore, the number of inspection steps can be reduced and manufacturing cost can be reduced as well.

When the wireless chip of this embodiment mode is formed using a thin film transistor formed of a semiconductor thin film as an active layer which is formed over a substrate having an insulating surface, such as a glass substrate, a quartz substrate, and a plastic substrate, a highly functional and low power consumption wireless chip can be provided.

Figure 14B:
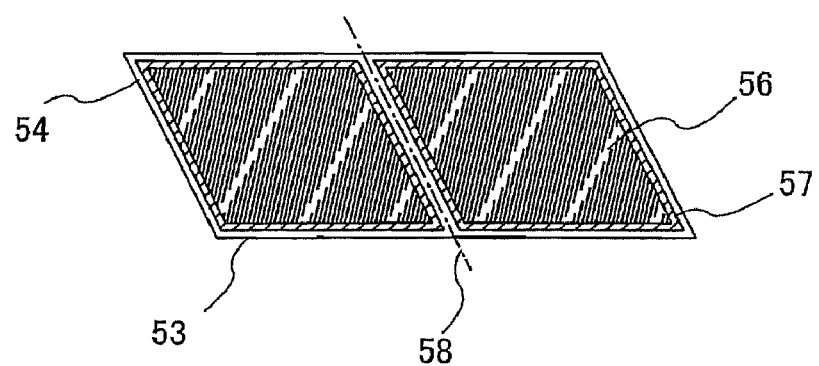

FIG. 14B shows an enlarged view and a dividing step of a wireless chip. The liquid crystal 56 sandwiched between the substrates is provided over the wireless chip 54 provided over the insulating substrate 53. A boundary between the adjacent wireless chips is partitioned by the spacer 57. Therefore, the liquid crystal 56 is not provided over a plurality of wireless chips. In order to achieve such a structure, the spacer 57 is provided over the substrate to sandwich the liquid crystal 56, the liquid crystal is dropped thereon, and the counter substrate is used to seal it. By dropping the liquid crystal in this manner, a liquid crystal element can be provided in a plurality of regions partitioned by the spacer 57.

After that, the substrate is divided with the wireless chip 54 and the liquid crystal element combined with each other. The substrate is divided in a region between the spacers 57 by a laser cut method, a scribing method, or the like.

By using the invention in this manner, a wireless chip which can be simply inspected can be provided.

Embodiment Mode 3

In this embodiment mode, a test routine in a test program for realizing an inspection method of a wireless chip of the invention is described with reference to FIGS. 16 to 21B. A test routine of this embodiment mode can be incorporated in the test program used in Embodiment Modes 1 and 2.

An operation of the test routine is described with reference to the flow chart of FIG. 16.

The arithmetic circuit 202 reads a test program from the data storing portion 221 and starts a test routine (start 501). The arithmetic circuit 202 determines a command code of the data storing portion (command code determination 502) and branches the process into a data copy routine (data copy routine 504), a ROM test routine (ROM test routine 505), and a RAM test routine (RAM test routine 506) depending on the kind of the command code, thereby any of the routines can be executed. It is needless to say that a plurality of the routines may be executed as well. At last, the arithmetic circuit 202 terminates a test routine (termination 503).

Figure 20:
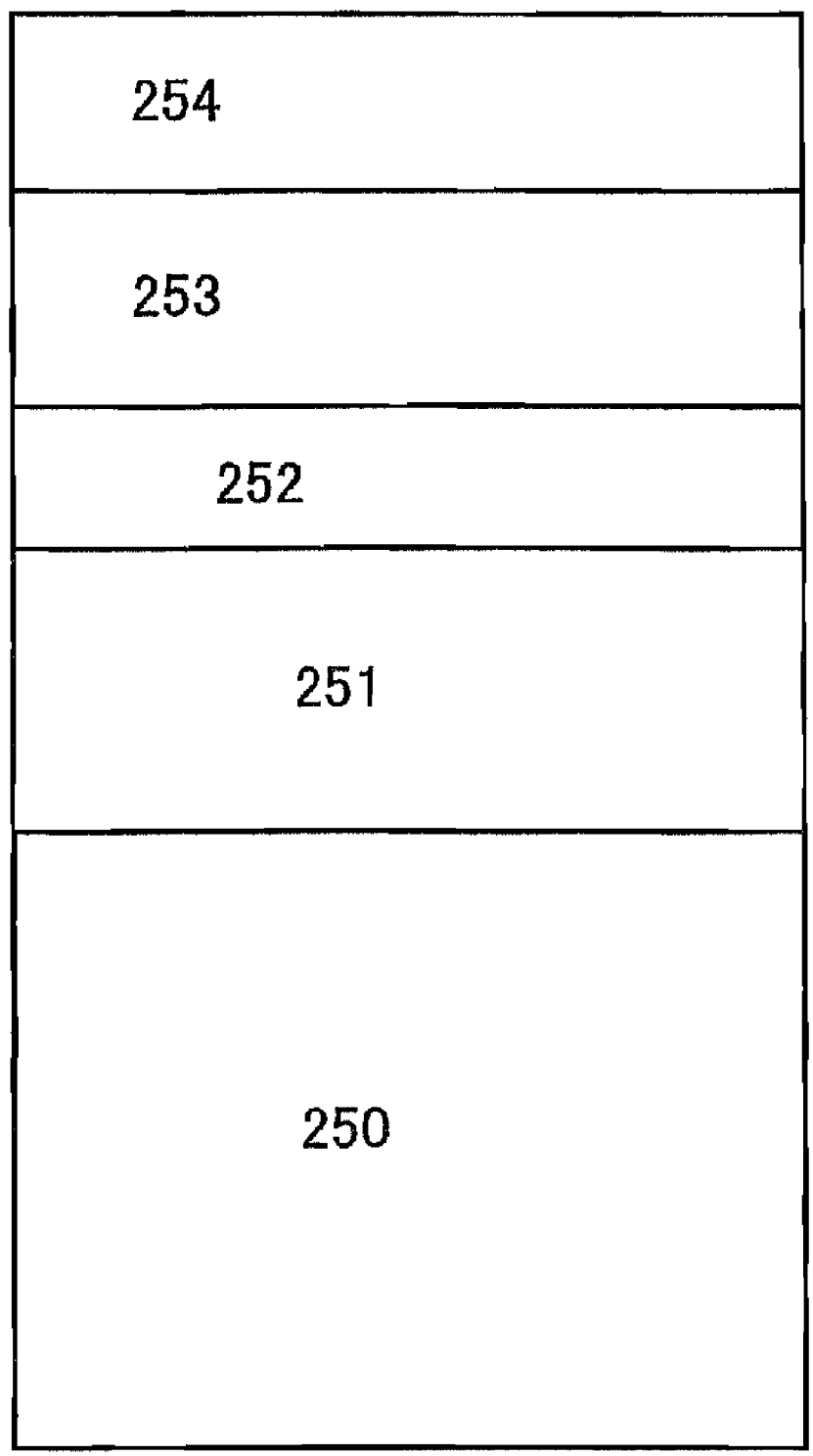
FIG. 20 is an address space included in a semiconductor device of the invention.

FIG. 20 shows an address space of the data storing portion 221. The data storing portion 221 includes a ROM 250, a RAM 251, a control register 252, a reception data register 253, and a transmission data register 254. The control register 252 includes a function to show any of a reception processing state, a data executing state, and a transmission processing state. The reception data register 253 has a function to store data received by the wireless chip. The transmission data register 254 has a function to store data transmitted by the wireless chip. Further, a reader/writer device which gives and receives data or power to/from the wireless chip also stores similar contents to FIG. 20.

Figure 16:
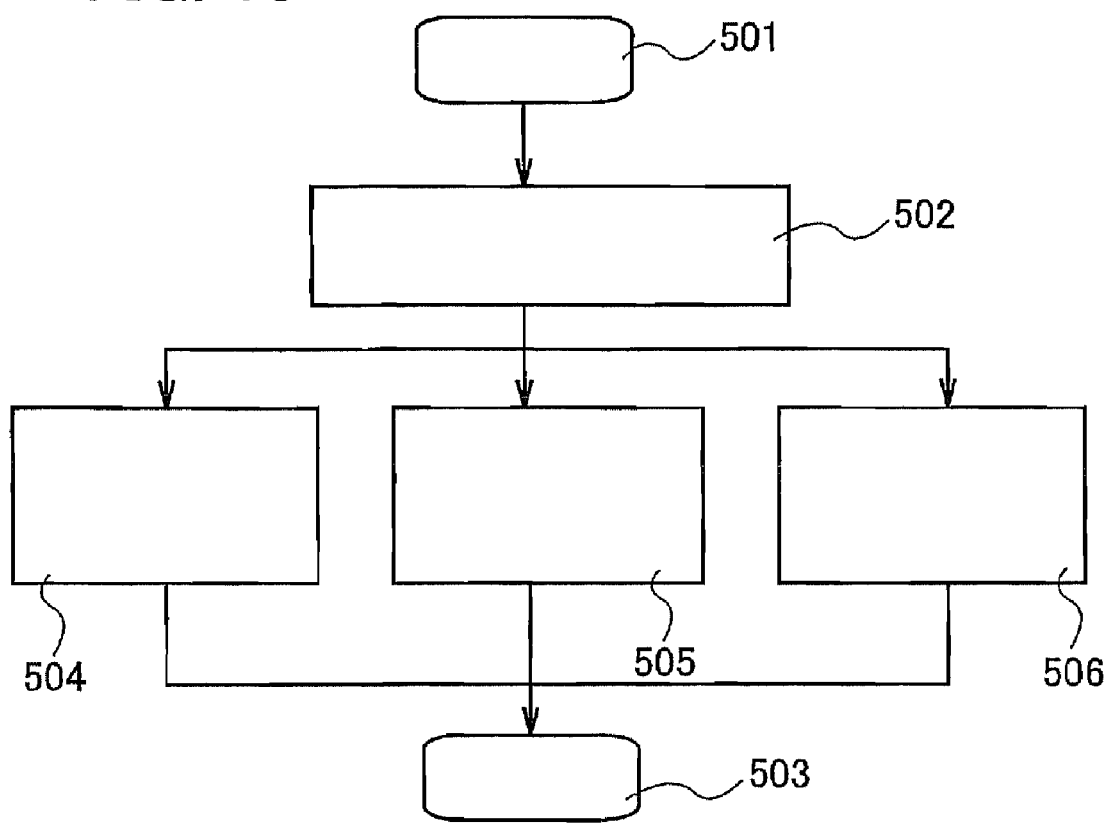
FIG. 16 is a flow chart showing an inspection method of the invention.
Figure 17:
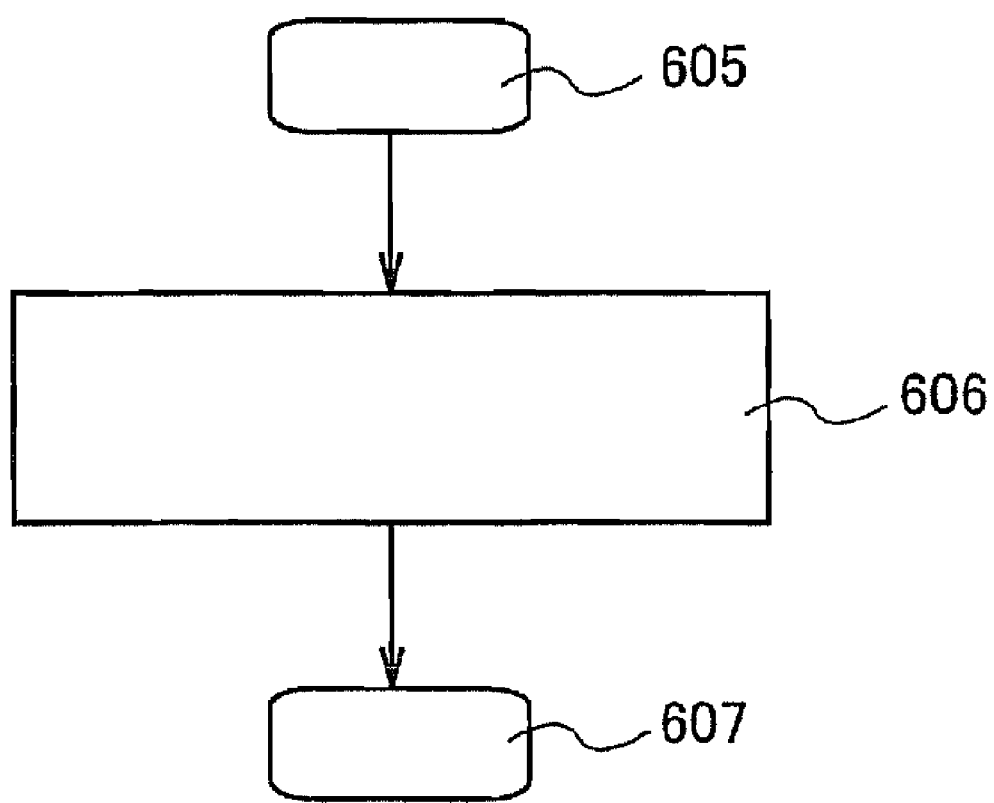
FIG. 17 is a flow chart showing an inspection method of the invention.
Figure 18:
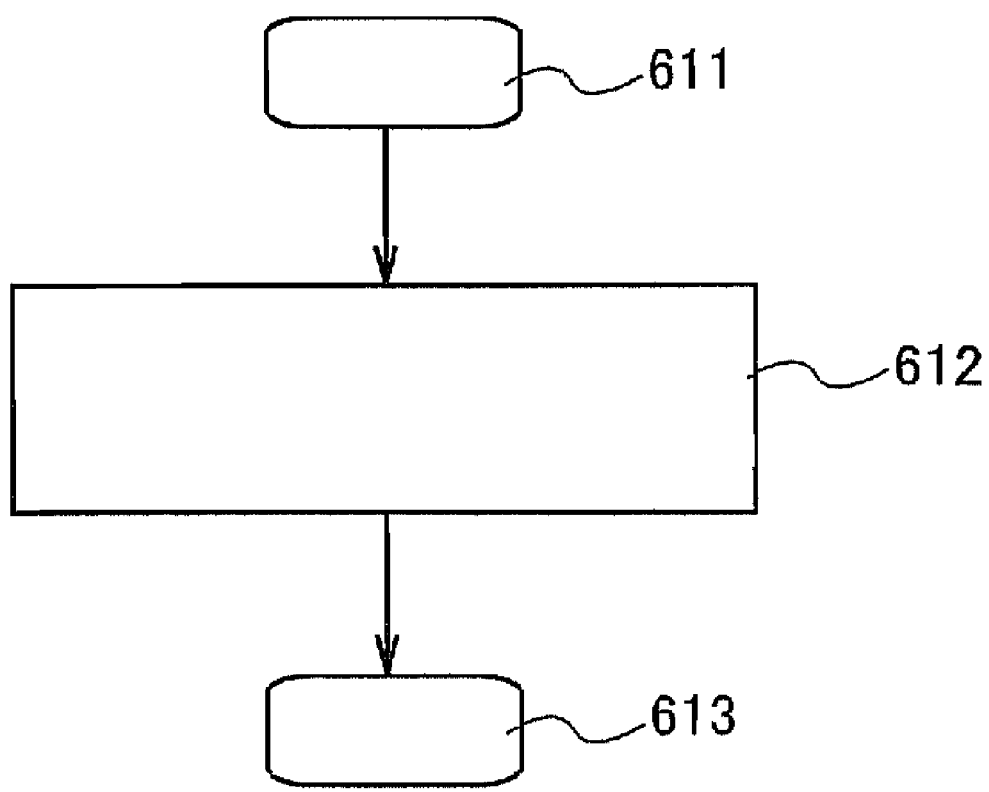
FIG. 18 is a flow chart showing an inspection method of the invention.
Figure 19:
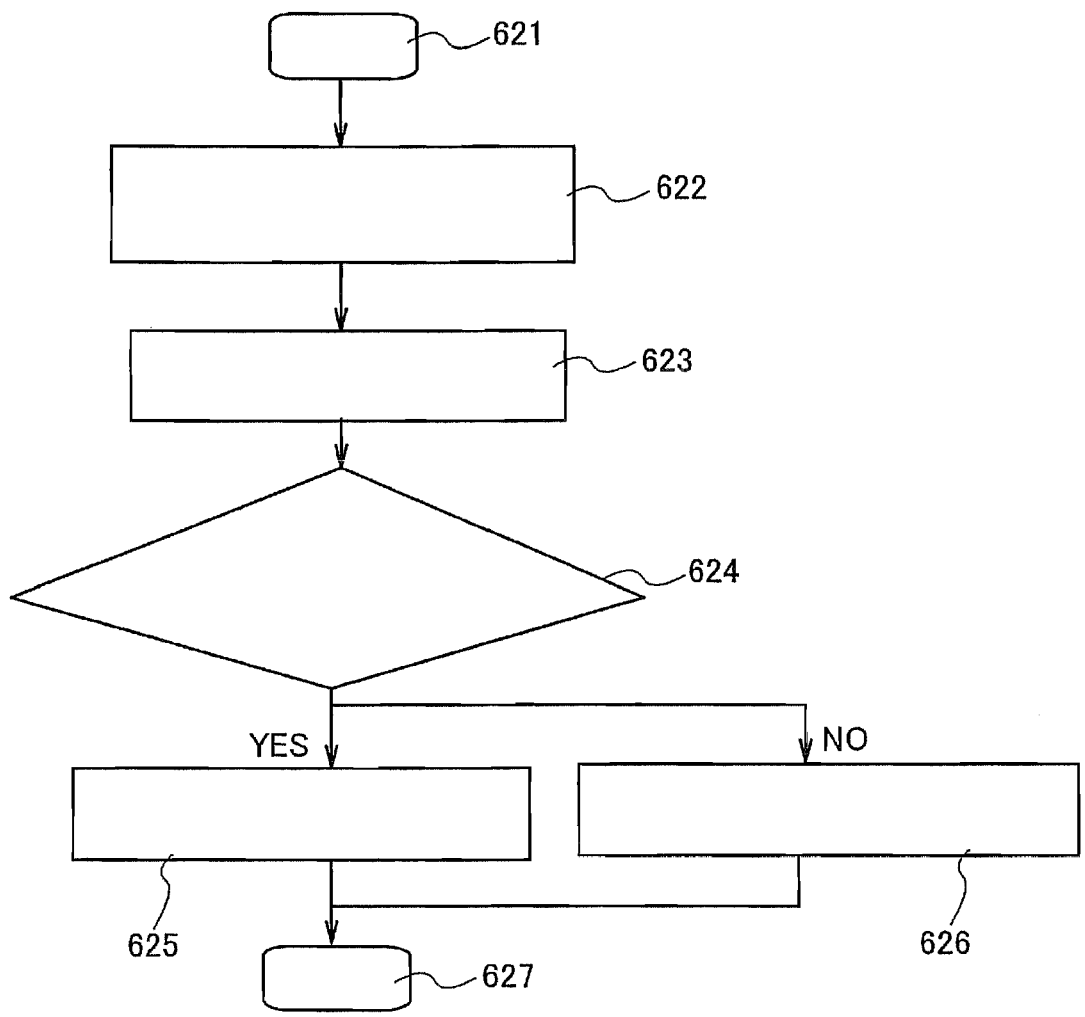
FIG. 19 is a flow chart showing an inspection method of the invention.

Next, the processes for the respective command codes included in FIG. 16 are described in details with reference to the flow charts in FIGS. 17 to 19.

FIG. 17 shows a flow chart of the data copy routine. The data copy routine is started depending on the kind of a command (start 605). After that, the reception data register is copied to the transmission data register (reception data register is copied to transmission data register 606). By copying the reception data register to the transmission data register, data becomes capable of wireless communication. Therefore, the data can be transmitted to a reader/writer device. Thereafter, the data is compared to the data stored in the reader/writer device to decide if the data match or do not match. Thus, the data copy routine is terminated (termination 607).

Such data copy routine can decide if original data and data to be copied match or do not match and can carry out an inspection simply. Further, a wire which generates a defect can be specified by the data of a non-match portion, therefore, the defect can be selectively fixed.

FIG. 18 is a flow chart of the ROM test routine. The ROM test routine is started depending on the kind of a command (start 611). Data of a selected address is copied to the transmission data register (data of selected address is copied to transmission data register 612). By copying the data of the selected address to the transmission data register, the data becomes capable of wireless communication. Therefore, the data can be transmitted to a reader/writer device. Thereafter, the data is compared to the address data stored in the reader/writer device to decide if the data match or do not match. Thus, the ROM test routine is terminated (termination 613).

Such ROM test routine can decide if original data and data to be copied match or do not match and can carry out an inspection simply. The inspection is carried out for an arbitrary address, but is not required to be carried out for all the addresses. The inspection is carried out by specifying an address in consideration of the probability of defect generation. It is needless to say that the inspection may be carried out for all the addresses as well. In that case, a wire generating a defect can be specified and selectively fixed.

FIG. 19 is a flow chart of the RAM test routine. The RAM test routine is started depending on the kind of a command (start 621). The data of the reception data register is copied to an appropriate address of the RAM (data of reception data register is copied to an appropriate address of RAM 622), and the data is read from the RAM (data is read from RAM 623). Next, the copied write data and the read data are decided to match or not (write data and read data are decided to match or not 624). If those data match (YES), an "OK" flag is written to the transmission data register to show that the inspection result is favorable ("OK" flag is written to the transmission data register 625), and thus the RAM test routine is terminated (termination 627). On the other hand, if those data do not match (NO), an "NG" flag is written to the transmission data register to show that the inspection result is defective ("NG" flag is written to the transmission data register 626), and thus the RAM test routine is terminated (termination 627).

The RAM test routine is a very important inspection since the RAM has a function to temporarily store an arithmetic result of a CPU. Further, a RAM has less capacity than a ROM, therefore, the inspection of a RAM is completed in a short period of time.

Figure 21A:
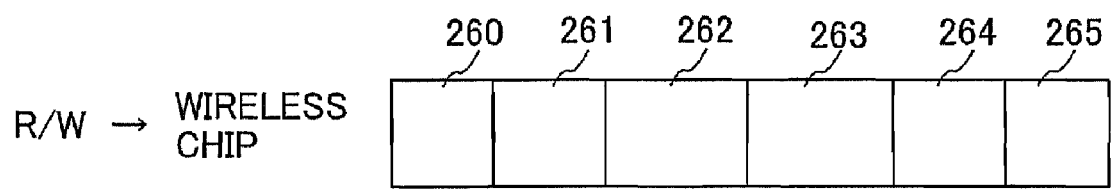
FIGS. 21A and 21B are data modes of a test program of the invention.

In order to carry out such inspection, data transmitted from the reader/writer device (R/W) to the wireless chip contains SOF 260, a flag 261, a command 262, data 263, CRC (Cyclic Redundancy Check) 264, and EOF 265 (see FIG. 21A). The command 262 can determine which test program to be executed.

Figure 21B:
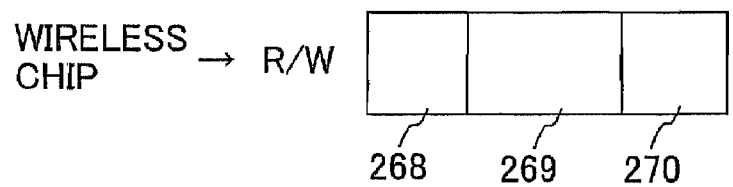

Data transmitted from the wireless chip to the reader/writer (R/W) contains SOF 268, data 269, and EOF 270 (see FIG. 21B). The data 269 is data to decide if the data copied to the transmission data register, that is the data stored in the reader/writer device match or not.

In the inspection described in this embodiment mode, data copied to the transmission data register and data stored in the reader/writer device may be decided to match or not a plurality of times. By conducting the decision a plurality of times, precision of the inspection can be enhanced.

With the aforementioned mode, in a wireless chip which is supplied with a power source voltage by induced electromotive force from communication signals and transmits and receives communication data, the wireless chip can be inspected in a short period of time in the case of an operation inspection of the components of an RF chip. Therefore, time required for the inspection step can be reduced, which can reduce the tact time of the inspection step and time required for manufacture. As a result, cost can be reduced.

When the wireless chip of this embodiment mode is formed using a thin film transistor formed of a semiconductor thin film as an active layer which is formed over a substrate having an insulating surface such as a glass substrate, a quartz substrate, and a plastic substrate, a highly functional and low power consumption wireless chip can be provided.

Embodiment Mode 4

In this embodiment mode, a manufacturing method of a wireless chip constituted by a thin film transistor formed over an insulating substrate is described.

Figure 15A:
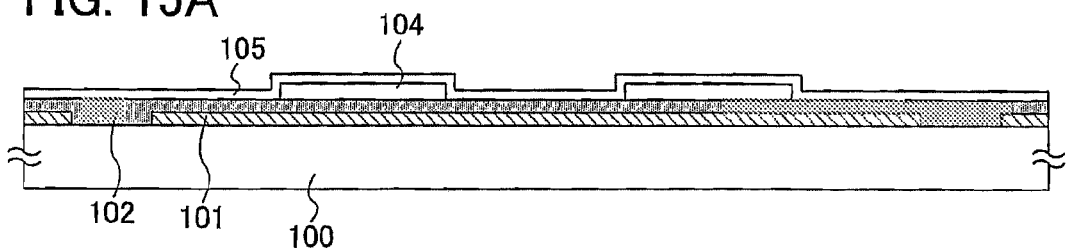
FIGS. 15A to 15E are views showing manufacturing steps of a semiconductor layer of the invention.

As shown in FIG. 15A, an insulating substrate 100 is prepared. A glass substrate, a quartz substrate, a plastic substrate, or the like can be used as the insulating substrate 100. Further, these substrates can be formed thinner by polishing the back surface or the like. Moreover, a substrate formed by providing a layer of an insulating material over a conductive substrate formed of a metal element or the like or a semiconductor substrate formed of silicon or the like can be used as well. By forming a wireless chip over, for example, a plastic substrate, a highly flexible, lightweight, and thin device can be manufactured.

A peeling layer 101 is selectively formed over the insulating substrate 100. The peeling layer 101 may be formed over the entire surface of the insulating substrate 100. The peeling layer 101 is formed of a single layer or stacked layers of a layer formed of an element selected from tungsten (W), molybdenum (Mo), titanium (Ti), tantalum (Ta), niobium (NO, nickel (Ni), cobalt (Co), zirconium (Zr), zinc (Zn), ruthenium (Ru), rhodium (Rh), palladium (Pd), osmium (Os), iridium (Ir), or silicon (Si), an alloy material or a compound material containing the aforementioned element as a main component. A crystal structure of a layer containing silicon is not particularly limited, but any of amorphous, microcrystal, and polycrystal structures can be employed.

A base layer 102 is formed over the peeling layer 101. The base layer 102 can be formed of a single layer or stacked layers of an insulating material such as silicon oxide, silicon nitride, or silicon oxynitride. In the case of stacking layers, a silicon oxynitride layer is formed with a thickness of 10 to 200 nm (preferably 50 to 100 nm) as a first layer of the base layer 102. The silicon oxynitride layer can be formed by using $SiH_4$, $NH_3$, $N_2O$, and $H_2$ as a reaction gas by a plasma CVD method. Subsequently, a silicon oxynitride layer is formed with a thickness of 50 to 200 nm (preferably 100 to 150 nm) as a second layer of the base layer 102. The silicon oxynitride layer can be formed by using $SiH_4$ and $N_2O$ as a reaction gas by a plasma CVD method.

A semiconductor layer 104 is formed over the base layer 102. The semiconductor layer 104 can be formed of silicon, a material formed of silicon and germanium, or the like. A crystal structure of the semiconductor layer 104 is not particularly limited, but any of amorphous, microcrystal, and polycrystal structures may be used.

In the case of forming the semiconductor layer 104 using a polycrystal material, heat treatment is to be performed to an amorphous semiconductor layer. One or a plurality of laser irradiation, a heating furnace, lamp irradiation, and the like can be used for the heat treatment.

For laser irradiation, a continuous wave type laser beam (CW laser) or a pulsed wave type laser beam (pulsed laser) can be used. As the laser beam, a laser beam emitted from one or a plurality of Ar laser, Kr laser, excimer laser, YAG laser, $Y_2O_3$ laser, $YVO_4$ laser, YLF laser, $YAlO_3$ laser, glass laser, ruby laser, alexandrite laser, Ti:sapphire laser, copper vapor laser, and gold vapor laser can be used. By irradiating the amorphous semiconductor layer with a fundamental wave of such a laser beam and any of a laser beam with high harmonic such as second to fourth harmonic of the fundamental wave, a silicon layer having crystals with a large grain size can be obtained. As the harmonic, a second harmonic (532 nm) or a third harmonic (355 nm) of Nd:$YVO_4$ laser (fundamental wave: 1064 nm) is preferably used. The laser requires a power density of approximately 0.01 to 100 $MW/cm^2$ (preferably, approximately 0.1 to 10 $MW/cm^2$). The laser is emitted at a scanning rate of approximately 10 to 2000 cm/sec.

A CW laser of a fundamental wave and a CW laser of a harmonic may be used for irradiation, or a CW laser of a fundamental wave and a pulsed laser of a harmonic may be used for irradiation. By using a plurality of laser light, a wide range of energy region can be treated.

It is also possible to use a pulsed laser beam with such a repetition rate that an amorphous silicon layer melted by a laser beam can be irradiated with the next pulsed laser beam before being solidified. By using a laser beam with such a repetition rate, a silicon layer with crystal grains that are continuously grown in the scan direction can be obtained. The repetition rate of such a laser beam is 10 MHz or higher, which is a much higher rate than that of tens to hundreds of Hz of a normally used laser beam.

When an annealing furnace is used for heat treatment, an amorphous silicon layer is heated at a temperature of 400 to 550° C. for 2 to 20 hours. At this time, the temperature is preferably set in multiple stages in the range of 400 to 550° C. so as to increase gradually. Hydrogen and the like contained in the amorphous silicon layer are exhausted in the first low temperature heating step at about 400° C., which leads to reduction in roughness of the surface generated in crystallization.

In the aforementioned heat treatment, a metal for promoting the crystallization of the semiconductor layer, for example nickel (Ni) is added. When the amorphous silicon layer is coated with a solution containing nickel (Ni) and subjected to the heat treatment, the heating temperature can be reduced and a polycrystalline silicon layer with a continuous crystal grain boundary can be obtained. As a metal for promoting the crystallization, nickel (Ni) as well as iron (Fe), ruthenium (Ru), rhodium (Rh), palladium (Pd), osmium (Os), iridium (Ir), platinum (Pt), copper (Cu), silver (Au), and the like may be employed.

Since the metal for promoting the crystallization becomes a source of pollution of a memory cell or the like, a gettering step for removing the metal is desirably performed after the semiconductor layer is crystallized. In the gettering step, after the semiconductor layer is crystallized, a layer functioning as a gettering sink is formed over the semiconductor layer and heated, so that the metal moves to the gettering sink. As the gettering sink, a polycrystalline semiconductor layer or a semiconductor layer to which an impurity is added can be used. For example, a polycrystalline silicon layer to which an inert element such as argon is added may be formed over the silicon layer so as to be used as the gettering sink. When the inert element is added to the gettering sink, distortion occurs and the metal can be captured more efficiently. Alternatively, the metal may be captured by adding an element such as phosphorus to a part of a semiconductor layer of a TFT without forming a gettering sink.

The thus formed semiconductor layer 104 is processed into a predetermined shape, thereby forming an island shape semiconductor layer 104. The processing is performed by etching using a mask that is formed by photolithography. As the etching, wet etching or dry etching can be used.

An insulating layer functioning as a gate insulating layer 105 is formed so as to cover the semiconductor layer 104. The gate insulating layer 105 can be formed using similar material and method to the base layer 102.

Figure 15B:
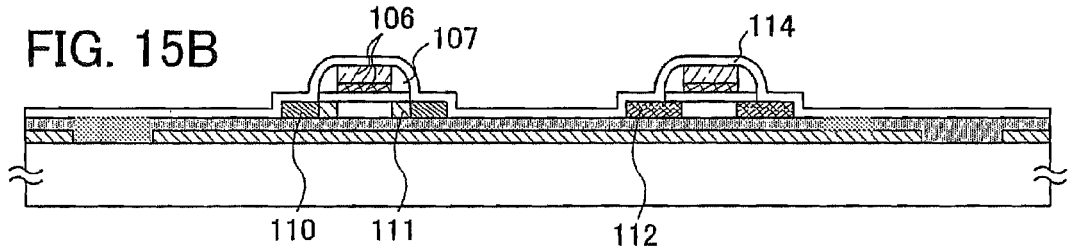

As shown in FIG. 15B, a conductive layer functioning as a gate electrode layer 106 is formed with the gate insulating layer 105 interposed therebetween. The gate electrode layer 106 can be formed using a film formed of aluminum (Al), titanium (Ti), molybdenum (Mo), tantalum (Ta), tungsten (W), or silicon (Si), or an alloy film containing these elements. The gate electrode layer 106 can have a single layer structure or a stacked-layer structure. As the stacked-layer structure, tantalum nitride and tungsten may be stacked. The gate electrode layer 106 is processed by etching using a mask which is formed by photolithography. As the etching, wet etching or dry etching can be used.

A sidewall 107 which functions as an insulating layer is formed on a side surface of the gate electrode layer 106. The sidewall 107 can be formed using similar material and method to the base layer 102. An edge portion of the sidewall 107 may be tapered by anisotropic etching. A short channel effect is particularly remarkable in an n-channel TFT, therefore, the sidewall 107 is preferably provided on a side surface of a gate electrode of an n-channel TFT.

In such a state, the gate insulating layer 105 is etched. As a result, a portion of the semiconductor layer 104 and the base layer 102 are exposed. As the etching, wet etching or dry etching can be used.

With the gate electrode layer 106 and the sidewall 107, an impurity element is added to the semiconductor layer 104 to form high concentration impurity regions 110 and 112. In the case of forming an n-channel TFT, phosphorus is used as the impurity element while boron is used in the case of forming a p-channel TFT. At this time, it is preferable to control the amount of impurity element to form a low concentration impurity region under the sidewall 107. In this embodiment mode, a low concentration impurity region 111 is formed in only an impurity region of an n-channel TFT. The low concentration impurity region 111 can prevent a short channel effect. A TFT structure having such a low concentration impurity region is called an LDD (Lightly Doped Drain) structure.

After that, an insulating layer 114 is formed so as to cover the base layer 102, the semiconductor layer 104, the gate electrode layer 106, and the sidewall 107. The insulating layer 114 may be formed of silicon oxide, silicon nitride, or the like by a CVD method.

After forming the insulating layer 114, heat treatment is performed as required. The heat treatment can be carried out similarly to the aforementioned crystallization. By this heat treatment, the impurity regions are activated. The insulating layer 114 formed by a CVD method contains a lot of hydrogen, therefore, the heat treatment can disperses the hydrogen, which leads to reduction in roughness of a film in the impurity regions.

Figure 15C:
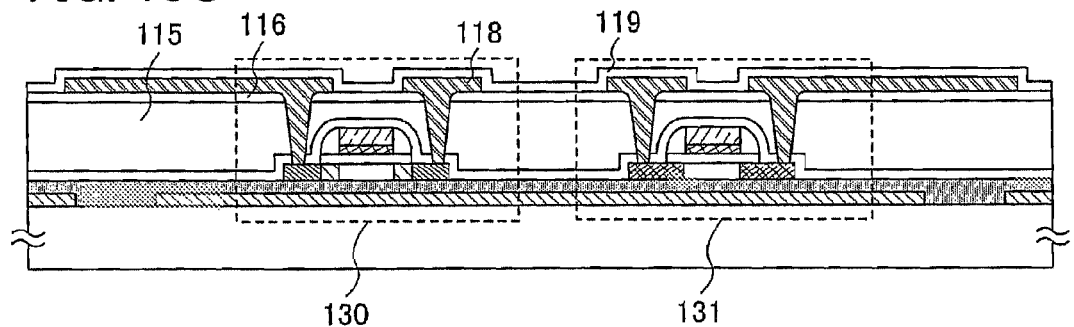

As shown in FIG. 15C, insulating layers 115 and 116 which function as interlayer insulating films are formed. An inorganic material or an organic material can be used for the insulating layers 115 and 116. As the inorganic material, silicon oxide, silicon nitride, silicon oxynitride, or the like can be used. As the organic material, polyimide, acrylic, polyamide, polyimide amide, benzocyclobutene, siloxane, or polysilazane can be used. It is to be noted that siloxane has a skeleton structure formed of a bond of silicon (Si) and oxygen (O). As a substituent, an organic group containing at least hydrogen (for example, an alkyl group or aromatic hydrocarbon) is used. As the substituent, a fluoro group may also be used. In addition, an organic group containing at least hydrogen and a fluoro group may be used as the substituent. Polysilazane is formed of a polymer material including a bond of silicon (Si) and nitrogen (N) as a starting material. In general, when using an inorganic material, an impurity element can be prevented from entering, while flatness can be enhanced when using an organic material. Therefore, in this embodiment mode, an inorganic material is used for the insulating layer 115 and an organic material is used for the insulating layer 116.

Next, openings are formed in the insulating layers 114, 115, and 116 by etching, thereby forming a wire 118 through a contact hole. The wire 118 can be formed of a film formed of an element selected from aluminum (Al), titanium (Ti), molybdenum (Mo), tantalum (Ta), tungsten (W), or silicon (Si) or an alloy film containing these elements. The wire 118 can be formed of a single layer or stacked layers. For example, tungsten, tungsten nitride, or the like as a first layer, an alloy of aluminum and silicon (Al—Si) or an alloy of aluminum and titanium (Al—Ti) as a second layer, and a titanium nitride film, a titanium film, or the like as a third layer may be sequentially stacked. The wire 118 is processed by etching using a mask which is formed by photolithography. As the etching, wet etching or dry etching can be used. The wire 118 is connected to the high concentration impurity regions 110 and 112 of the semiconductor layer 104.

In this manner, an n-channel TFT 130 and a p-channel TFT 131 can be formed.

After that, a protective layer 119 is formed over the wire 118 as required. The protective layer 119 can be formed of silicon oxide, silicon nitride, or the like. For example, the protective layer 119 is formed of silicon nitride. As a result, the TFT is protected.

Figure 15D:
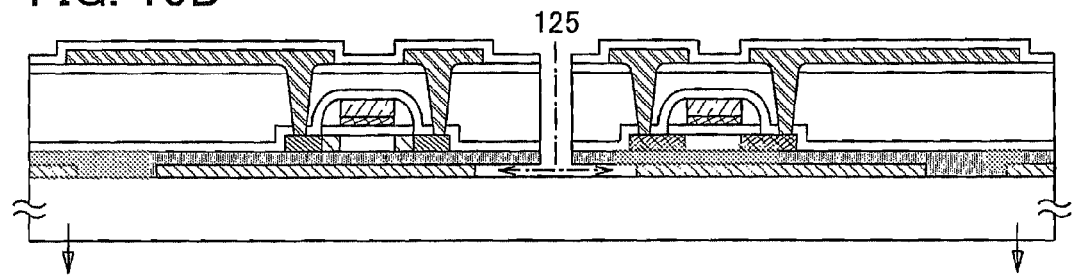

Here, as shown in FIG. 15D, an opening portion is formed at a desired position in a region where a TFT is not formed, and etchant 125 is introduced in the opening portion. The opening portion can be formed by wet etching or dry etching. For the etchant 125, a material suitable for the quality of the layer to be etched is selected, that is a material suitable for the peeling layer. For example, for wet etching, a mixed solution in which hydrofluoric acid is diluted with ammonium fluoride, a mixed solution of hydrofluoric acid and nitric acid, a mixed solution of hydrofluoric acid, nitric acid, and acetic acid, a mixed solution of hydrogen peroxide and sulfuric acid, a mixed solution of hydrogen peroxide, an ammonium solution, and water, a mixed solution of hydrogen peroxide, hydrochloric acid, and water, or the like can be used. For dry etching, a gas containing halogen-based atoms or molecules such as fluoride or a gas containing oxygen is used. It is preferable to use a gas or a solution containing halogen fluoride or an interhalogen compound, for example, chlorine trifluoride ($ClF_3$) as the etchant.

By introducing the etchant 125, the peeling layer 101 is removed. Then, the insulating substrate 100 is peeled off. In this manner, a thin and lightweight wireless chip can be manufactured.

In addition to the aforementioned methods, the etchant may be introduced by exposing the peeling layer 101 by a method such as laser drawing or cutting a side of the wireless chip. Further, the insulating substrate 100 may be physically peeled off without using the etchant.

Figure 15E:
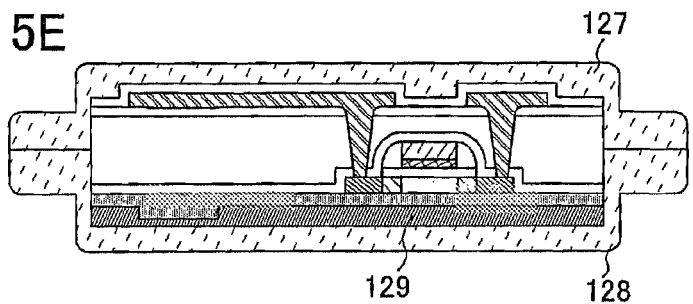

As shown in FIG. 15E, by covering the TFT, which is peeled off, with films 127 and 128, a wireless chip is completed. At this time, the films 127 and 128 may be attached by using an adhesive layer 129. A protective layer may be formed over the films 127 and 128 to prevent moisture, oxygen, or the like from entering. As the protective layer 119 is formed over the wire 118, a protective film may be formed under the base layer 102 or the adhesive layer 129. The protective film can be formed of silicon oxide, silicon nitride, or the like.

The wireless chip formed over the insulating substrate and peeled off the insulating substrate can be provided with lightweight and at low cost. Further, as such a wireless chip is highly flexible, it can be attached to a curved surface and mounted on various objects.

Embodiment Mode 5

Figure 24:
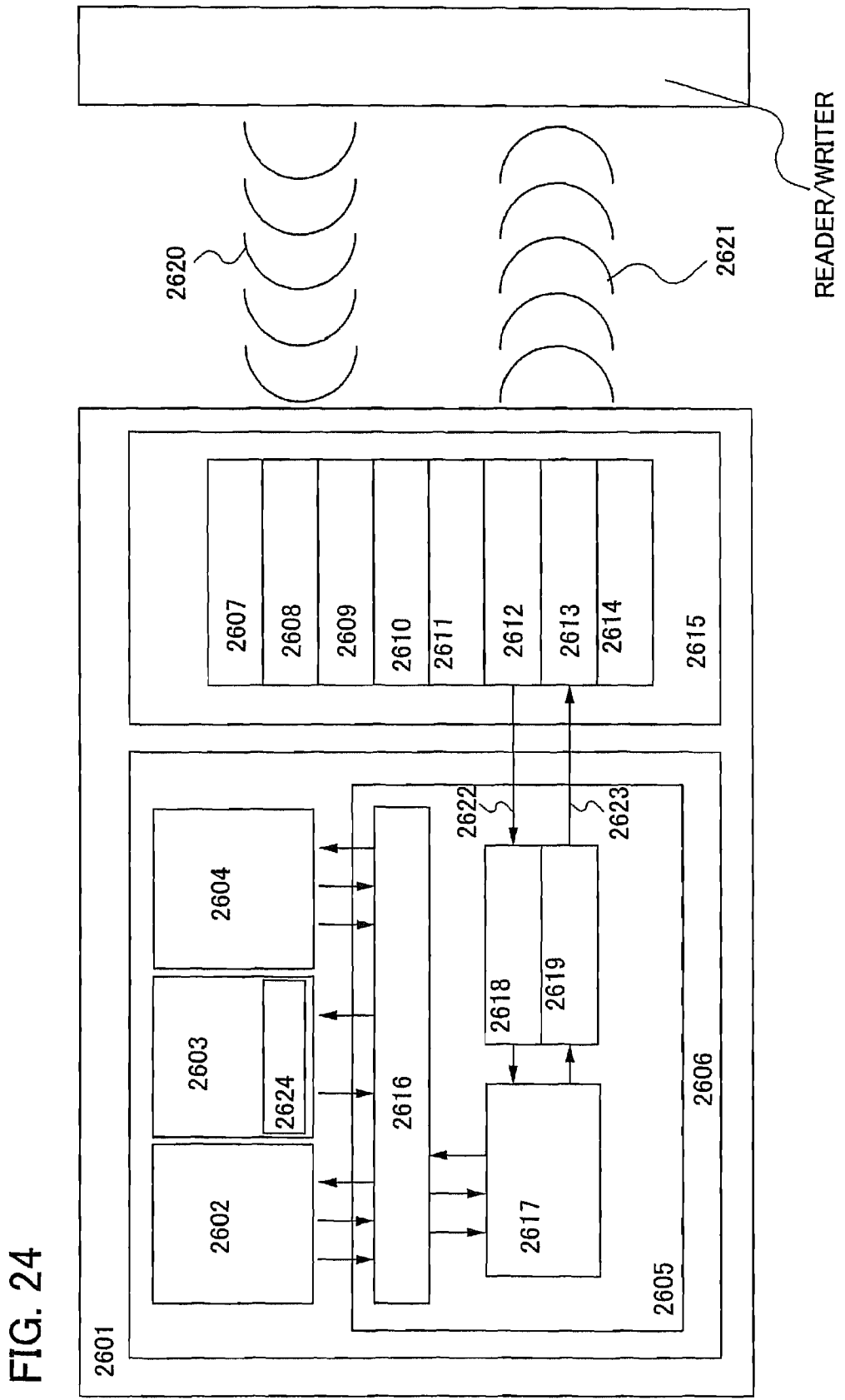
FIG. 24 is a block diagram showing a semiconductor device of the invention.
Figure 25:
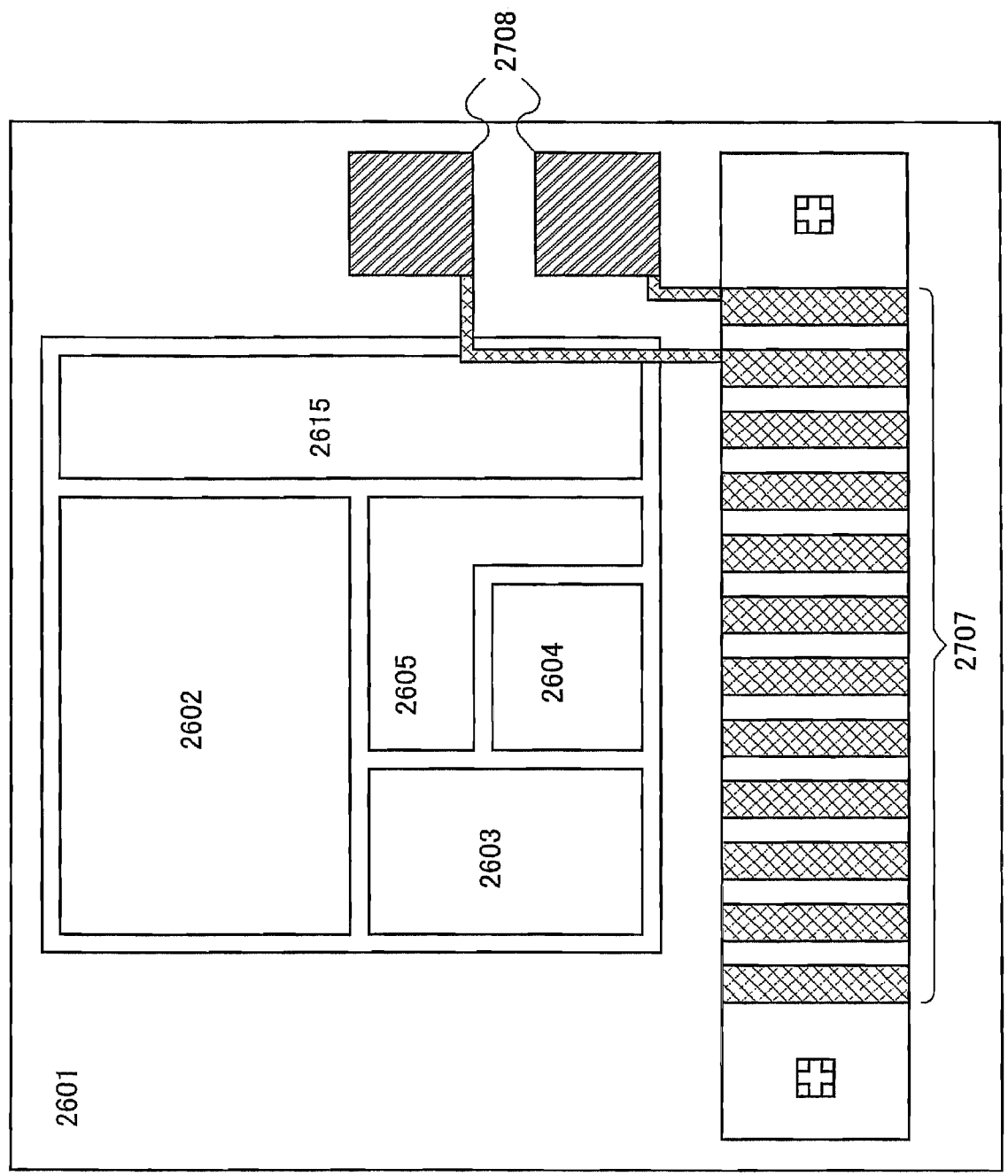
FIG. 25 is a block diagram showing a semiconductor device of the invention.
Figure 26:
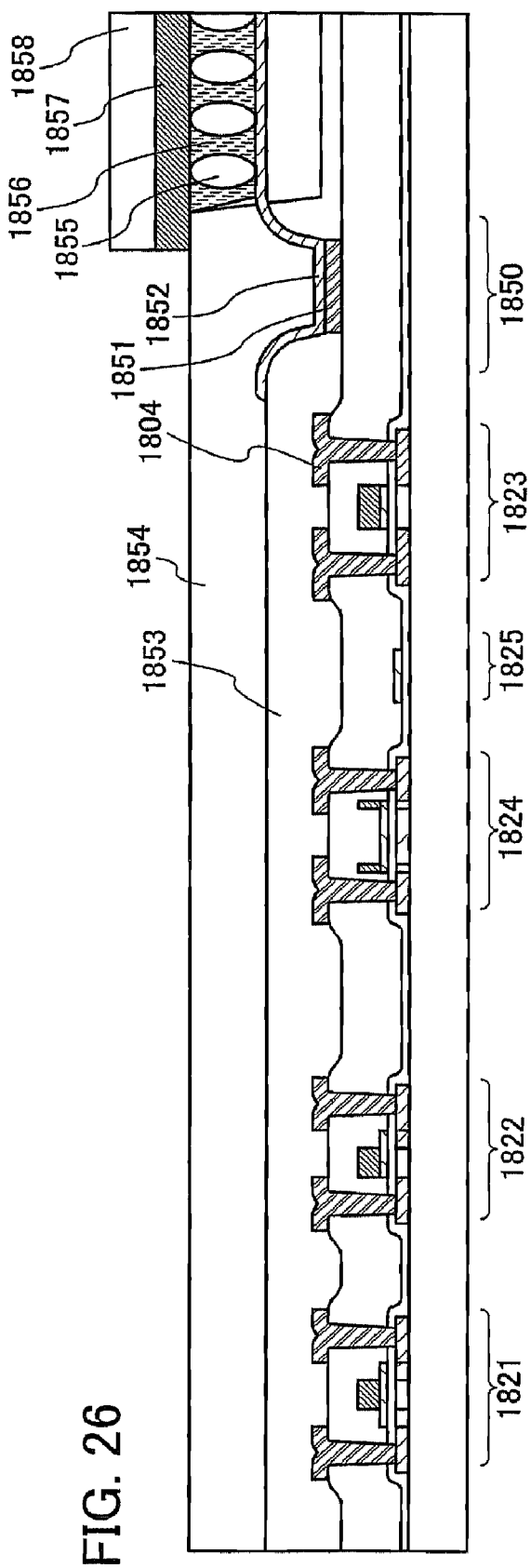
FIG. 26 is a sectional view of a semiconductor device of the invention.

This embodiment mode describes a wireless chip having an encryption function with reference to FIGS. 24 to 26 as an example of a semiconductor device of the invention. FIG. 24 is a block diagram of the wireless chip, FIG. 25 is a layout diagram of the wireless chip, and FIG. 26 is a sectional view of a portion of the wireless chip.

First, a block configuration of the wireless chip is described with reference to FIG. 24. In FIG. 24, a wireless chip 2601 includes an arithmetic circuit 2606 constituted by a CPU 2602, a ROM 2603, a RAM 2604, and a controller 2605, and an analog portion 2615 constituted by an antenna 2607, a resonant circuit 2608, a power source circuit 2609, a reset circuit 2610, a clock generating circuit 2611, a demodulation circuit 2612, a modulation circuit 2613, and a power source managing circuit 2614. The controller 2605 is constituted by a CPUIF 2616 as an interface of the CPU, a control register 2617, a code extracting circuit 2618, and an encoding circuit 2619. It is to be noted in FIG. 24 that communication signals are shown as different signals for simplicity as a reception signal (encoded text) 2620 and a transmission signal (plain text) 2621, however, they are actually combined and simultaneously transmitted and received between the wireless chip 2601 and a reader/writer device. The reception signal (encoded text) 2620 is demodulated by the demodulation circuit 2621 after being received by the antenna 2607. The transmission signal (plain text) 2621 is transmitted from the antenna 2607 after being modulated by the modulation circuit 2613. It is to be noted that the plain text refers to a signal containing no encoded text.

In FIG. 24, when the wireless chip 2601 is placed in a magnetic field formed by a communication signal, an induced electromotive force is generated by the antenna 2607 and the resonant circuit 2608. The induced electromotive force is held by electric capacitance of the power source circuit 2609, stabilized in potential by the electric capacitance, and supplied as a power source voltage to each circuit in the wireless chip 2601. The reset circuit 2610 generates a reset signal for initializing the whole wireless chip 2601. For example, a signal which rises with a delay to a rise of the power source voltage is generated as a reset signal. The clock generating circuit 2611 changes a frequency and a duty ratio of a clock signal in accordance with a control signal generated by a power source managing circuit 2614. The demodulation circuit 2612 detects a change in amplitude of the reception signal (encoded text) 2620 of an ASK method as reception data 2622 of "0" or "1". For example, a low pass filter is used as the demodulation circuit 2612. The demodulation circuit 2613 transmits transmission data by changing the amplitude of the transmission signal (plain text) 2621 of an ASK method. For example, when transmission data 2623 is "0", a resonance point of the resonant circuit 2608 is changed so as to change the amplitude of the communication signal. The power source managing circuit 2614 manages a power source voltage supplied from the power source circuit 2609 to the arithmetic circuit 2606 and the current consumption at the arithmetic circuit 2606, and generates a control signal for changing the frequency and the duty ratio of the clock signal at the clock generating circuit 2611.

An operation of a wireless chip of this embodiment mode is described. First, the reception signal (encoded text) 2620 containing encoded text data is received by the wireless chip 2601. The reception signal (encoded text) 2620 is demodulated by the demodulation circuit 2612, divided into a control command, the encoded text data, and the like by the code extracting circuit 2618, and stored in the control register 2617. Here, the control command is data to specify a response of the wireless chip 2601. For example, transmission of a specific ID, operation stop, encryption, or the like is specified. Here a control command for encryption is received.

Subsequently, in the arithmetic circuit 2606, the CPU 2602 decrypts (decodes) the encoded text by using a secret key 2624 stored in the ROM 2603 in advance in accordance with a decryption program stored in the ROM 2603. The decoded text is stored in the control register 2617. At this time, the RAM 2604 is used as a data storing region. It is to be noted that the CPU 2602 accesses the ROM 2603, the RAM 2604, and the control register 2617 through the CPUIF 2616. The CPUIF 2616 has a function to generate an access signal for any of the ROM 2603, the RAM 2604, and the control register 2617 from an address requested by the CPU 2602.

At last, the transmission data 2623 is generated from the decoded text in the encoding circuit 2619 and modulated in the modulation circuit 2613, thereby the transmission signal (plain text) 2621 is transmitted from the antenna 2607 to the reader/writer.

It is to be noted in this embodiment mode that a method to process by software, that is a method to constitute an arithmetic circuit by a CPU and a large capacity memory and execute a program by the CPU is employed as an arithmetic method, however, the most suitable arithmetic method can be selected for application and the arithmetic circuit can be constituted based on the selected method. For example, as the arithmetic method, a method to process the operation by hardware and a method to use both hardware and software can be suggested. In the method to process by hardware, a dedicated circuit may be used to constitute the arithmetic circuit. In the method to use both hardware and software, a dedicated circuit, a CPU, and a memory may be used to constitute the arithmetic circuit, where the dedicated circuit performs a part of an arithmetic process and the CPU executes a program of the rest of the arithmetic process.

Next, a layout of a wireless chip is described with reference to FIG. 25. It is to be noted in FIG. 25 that a portion corresponding to FIG. 24 is denoted by the same reference numeral and the description thereof is omitted here.

In FIG. 25, an FPC pad 2707 is an electrode pad group used for attaching an FPC (Flexible Printed Circuit) to the wireless chip 2601. Antenna bumps 2708 are electrode pads for attaching an antenna. It is to be noted that an excessive pressure may be applied to the antenna bumps 2708 when attaching the antenna. Therefore, it is preferable not to provide a component which constitutes a circuit such as a transistor under the antenna bumps 2708.

The FPC pad 2707 is effectively used mainly for failure analysis. As a wireless chip obtains a power source voltage by communication signals, an arithmetic circuit does not operate at all when an antenna or a power source circuit has a defect. As a result, failure analysis is extremely difficult when the antenna or the power source circuit has a defect. However, by supplying a power source voltage to the wireless chip 2601 from the FPC through the FPC pad 2707 and inputting appropriate electrical signals instead of electrical signals supplied from the antenna, the arithmetic circuit can be operated. Therefore, failure analysis can be carried out even when the antenna or the power source circuit has a defect.

Further, it is further effective to provide the FPC pad 2707 where measurement using a prober is possible. That is, by providing the electrode pads in the FPC 2707 in accordance with a pitch of the needles of a prober, measurement can be carried out using the prober. By using a prober, the number of steps to attach the FPC in the failure analysis can be reduced. Moreover, measurement can be carried out when a plurality of wireless chips are formed over a substrate, therefore, the number of steps to divide the substrate into each wireless chip can be reduced as well. In the case of mass production, the inspection of wireless chips can be carried out before a step of attaching the antenna. Therefore, as a defective product can be sorted in an early stage of the manufacturing step, manufacturing cost can be reduced.

FIG. 26 is a sectional view of such a wireless chip. First, elements up to a wire 1804 corresponding to the wire 118 shown in FIG. 15 are formed. An insulating layer 1853 is formed so as to cover the wire 1804. The insulating layer 1853 can be formed of an inorganic material or an organic material. As the inorganic material, silicon oxide, silicon nitride, or the like can be used. As the organic material, polyimide, acrylic, polyamide, polyimide amide, benzocyclobutene, siloxane, or polysilazane can be used. It is to be noted that siloxane has a skeleton structure formed of a bond of silicon (Si) and oxygen (O). As a substituent, an organic group containing at least hydrogen (for example, an alkyl group or aromatic hydrocarbon) is used. As the substituent, a fluoro group may also be used. In addition, an organic group containing at least hydrogen and a fluoro group may be used as the substituent. Polysilazane is formed of a polymer material including a bond of silicon (Si) and nitrogen (N) as a starting material.

In a connecting region 1850, an opening portion is formed in the insulating layer 1853 so that a wire 1851 formed simultaneously with the wire 1804 is exposed. It is preferable that the opening portion have top edge corner portions which are rounded and tapered sides. This can prevent a discontinuity of a pattern to be formed later.

A connecting wire 1852 is formed in the opening portion. The connecting wire 1852 can be formed of a film which is formed of an element selected from aluminum (Al), titanium (Ti), molybdenum (Mo), tungsten (W), or silicon (Si), an alloy film containing these elements, or the like. Further, a light-transmissive material such as indium tin oxide (ITO), indium tin oxide (ITSO) containing silicon oxide, or indium oxide containing zinc oxide by 2 to 20% can be used. At this time, the connecting wire 1852 is arranged so as not to overlap n-channel TFTs 1821 and 1822, a capacitor 1824, a resistor 1825, a p-channel TFT 1823, and the like. This prevents unexpected parasitic capacitance to be generated.

An insulating layer 1854 is formed so as to cover the insulating layer 1853 and the connecting wire 1852. The insulating layer 1854 can be formed similarly to the insulating layer 1853.

An opening portion is formed in the insulating layer 1854 so that the connecting wire 1852 provided over the insulating layer 1853 is exposed. In the opening portion, an anisotropic conductor 1856 including a conductive particle 1855 is provided, to which an FPC 1858 having a conductive layer 1857 is connected.

In this manner, a wireless chip of the invention can be manufactured.

Embodiment Mode 6

An antenna may have a size and a shape suitable for the application and in a range determined by Wireless Telegraphy Act. A signal to be transmitted and received has a frequency of 125 kHz, 13.56 MHz, 915 MHz, 2.45 GHz, or the like, which is standardized by ISO standard or the like. For the antenna, a dipole antenna, a patch antenna, a loop antenna, a Yagi antenna, or the like may be used. In this embodiment mode, a shape of an antenna connected to the wireless chip is described.

Figure 27A:
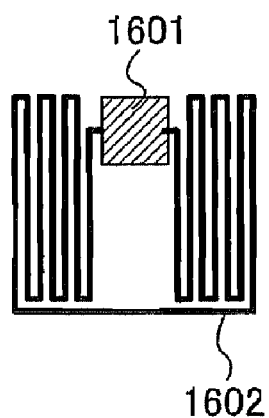
FIGS. 27A to 27D are views of shapes of an antenna included in a semiconductor device of the invention.

FIG. 27A shows an antenna 1602 connected to a wireless chip 1601. In FIG. 27A, the wireless chip 1601 is provided in a center portion and the antenna 1602 is connected to a connecting terminal of the wireless chip 1601. In order to secure the length of the antenna, the antenna 1602 is folded at a plurality of portions.

Figure 27B:
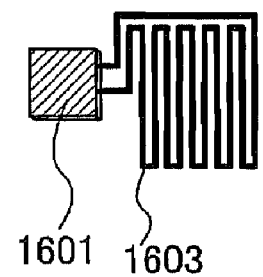

In FIG. 27B, the wireless chip 1601 is provided on one end side and an antenna 1603 is connected to a connecting terminal of the wireless chip 1601. In order to secure the length of the antenna, the antenna 1603 is folded at a plurality of portions.

Figure 27C:
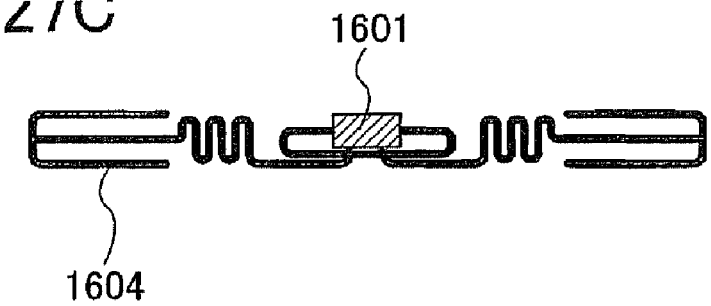

In FIG. 27C, an antenna 1604 having a plurality of folded portions is provided at both ends of the wireless chip 1601.

Figure 27D:
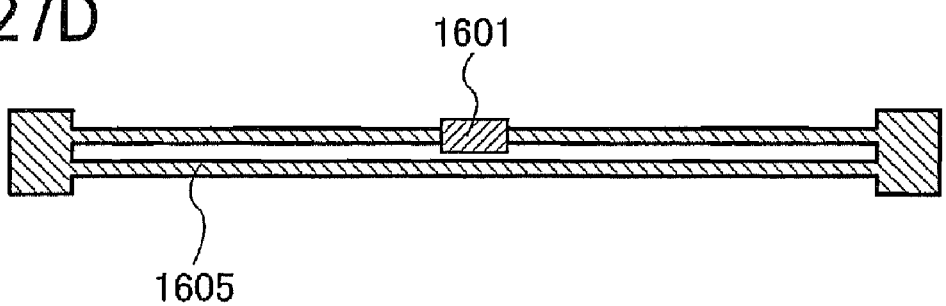

In FIG. 27D, a linear antenna 1605 is provided at both ends of the wireless chip 1601.

In this manner, a shape of an antenna may be selected to be suitable for a structure, a polarized wave, or an application of a wireless chip. Therefore, a folded dipole antenna may be used for the dipole antenna. A circular loop antenna or a square loop antenna may be used as the loop antenna. A circular patch antenna or a square patch antenna may be used as the patch antenna.

In the case of using a patch antenna, an antenna formed of a dielectric material such as ceramic may be used. By setting a dielectric constant of a dielectric material to be used as a substrate for the patch antenna, the antenna can be downsized. Moreover, as a patch antenna has a high mechanical strength, it can be used repeatedly.

A dielectric material of a patch antenna can be formed of ceramic, an organic resin, a mixture of ceramic and an organic resin, or the like. A typical example of ceramic is alumina, glass, forstelite, or the like. Moreover, a plurality of ceramic may be mixed to be used. In order to obtain a high dielectric constant, it is preferable to form a dielectric layer using a ferroelectric material. A typical example of a ferroelectric material is barium titanate ($BaTiO_3$), lead titanate ($PbTiO_3$), strontium titanate ($SrTiO_3$), lead zirconate ($PbZrO_3$), lithium niobate ($LiNbO_3$), zircon lead titanate (PZT), or the like. Furthermore, a plurality of ferroelectric materials may be mixed to be used.

The aforementioned embodiment modes and the structure described therein can be applied to the wireless chip 1601.

Embodiment 1

In this embodiment, the method described in Embodiment Mode 5 is used to carry out a test, thereby measurement was carried out by a spectrum analyzer. A response signal was outputted with respect to an RF signal having a frequency of 13.56 MHz, which was inputted to a wireless chip.

Figure 28A:
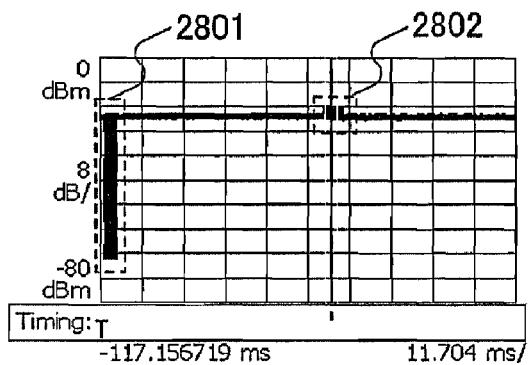
FIGS. 28A to 28C are diagrams showing results of measurements carried out by the invention.
Figure 28B:
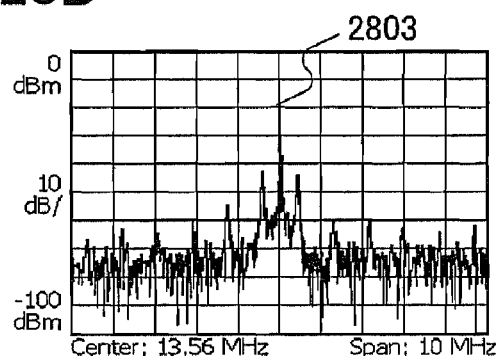
Figure 28C:
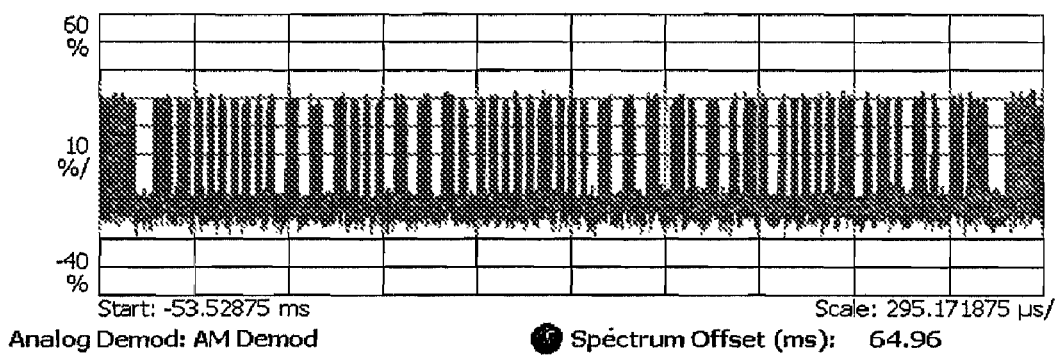

FIGS. 28A to 28C show measurement results of transmission/reception signal waveforms of a wireless chip, which were measured by a spectrum analyzer. A gain-frequency measurement result shown in FIG. 28B shows frequency characteristics gained by the wireless chip. The frequency is shown by the horizontal axis while the gain is shown by the vertical axis. There is a peak 2803 at the frequency of 13.56 MHz, which means that the wireless chip has high sensitivity to 13.56 MHz. FIG. 28A shows a change with time of a gain by the wireless chip at the gain-time measurement result frequency of 13.56 MHz. Time is shown by the horizontal axis while the gain is shown by the vertical axis. A waveform of a region 2801 shows a transmission signal from a reader/writer to the wireless chip, which is a transmission signal (encoded text) 2620 containing encoded text data. Further, a waveform of a region 2802 shows a response signal from the wireless chip to the reader/writer, which is a transmission signal (plain text) 2621. FIG. 28C shows a gain-time measurement result, which is an enlargement of the region 2802. FIG. 28C shows details of the response signals from the wireless chip to the reader/writer.

According to the measurement results of this embodiment, it is effective to carry out a test using the method described in Embodiment Mode 5.

This application is based on Japanese Patent Application serial no. 2005-228639 filed in Japan Patent Office on 5 Aug. 2005, the entire contents of which are hereby incorporated by reference.

What is claimed is:

1. A semiconductor device comprising:
an RF circuit for receiving a reception signal and transmitting a transmission signal by wireless communication, the RF circuit comprising an antenna, a resonant circuit, a power source circuit, a reset circuit, a clock circuit, a demodulation circuit, and a modulation circuit;
a reception circuit for extracting a test program from a signal demodulated by the demodulation circuit;
a data storing portion comprising a memory which stores the test program; and
a liquid crystal driver portion operationally connected with the data storing portion.

2. A semiconductor device according to claim 1 wherein the demodulation circuit comprises a low pass filter.

3. A semiconductor device according to claim 1 wherein the data storing portion further comprises a control register, a reception data register, and a transmission data register.

4. A semiconductor device according to claim 1 wherein the memory of the data storing portion comprises a read only memory.

5. A semiconductor device according to claim 1 wherein the memory of the data storing portion comprises a random access memory.

6. A semiconductor device according to claim 1 wherein the memory of the data storing portion comprises a mask read only memory.

7. A semiconductor device according to claim 1 wherein the memory of the data storing portion comprises a static random access memory.

8. A semiconductor device according to claim 1, further comprising a state control register operationally connected with the reception circuit,
wherein the state control register becomes a test program executing state.

9. A semiconductor device according to claim 1, further comprising an arithmetic circuit,
wherein the arithmetic circuit determines a test result by executing the test program,
wherein the liquid crystal driver portion comprises a liquid crystal molecule and a switching element, and
wherein the liquid crystal molecule is controlled by applying a voltage to the switching element in accordance with the test result.

10. A semiconductor device comprising:
an RF circuit for receiving a reception signal and transmitting a transmission signal by wireless communication, the RF circuit comprising an antenna, a resonant circuit, a power source circuit, a reset circuit, a clock circuit, a demodulation circuit, and a modulation circuit;
a reception circuit for extracting a test program from a signal demodulated by the demodulation circuit;
a data storing portion comprising a memory which stores the test program;
a liquid crystal driver portion operationally connected with the data storing portion and comprises a substrate, a pixel electrode provided over the substrate, a liquid crystal molecule provided over the pixel electrode, and a counter electrode provided over the liquid crystal molecule; and
an arithmetic circuit for controlling the liquid crystal molecule, the arithmetic circuit operationally connected with the data storing portion.

11. A semiconductor device according to claim 10 wherein the demodulation circuit comprises a low pass filter.

12. A semiconductor device according to claim 10 wherein the data storing portion further comprises a control register, a reception data register, and a transmission data register.

13. A semiconductor device according to claim 10 wherein the memory of the data storing portion comprises a read only memory.

14. A semiconductor device according to claim 10 wherein the memory of the data storing portion comprises a random access memory.

15. A semiconductor device according to claim 10 wherein the memory of the data storing portion comprises a mask read only memory.

16. A semiconductor device according to claim 10 wherein the memory of the data storing portion comprises a static random access memory.

17. A semiconductor device according to claim 10, further comprising a state control register operationally connected with the reception circuit,
- wherein the state control register becomes a test program executing state.

18. A semiconductor device according to claim 10,
- wherein the arithmetic circuit determines a test result by executing the test program,
- wherein the liquid crystal driver portion further comprises a switching element, and
- wherein the liquid crystal molecule is controlled by applying a voltage to the switching element in accordance with the test result.

* * * * *